United States Patent
Lee et al.

(10) Patent No.: US 10,903,308 B2
(45) Date of Patent: Jan. 26, 2021

(54) SEMICONDUCTOR DEVICE

(71) Applicant: SAMSUNG ELECTRONICS CO., LTD., Suwon-si (KR)

(72) Inventors: Hyun-suk Lee, Hwaseong-si (KR); Ji-won Yu, Yongin-si (KR); Ji-woon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/508,695

(22) Filed: Jul. 11, 2019

(65) Prior Publication Data
US 2019/0333985 A1 Oct. 31, 2019

Related U.S. Application Data

(63) Continuation-in-part of application No. 15/448,683, filed on Mar. 3, 2017, now Pat. No. 10,355,073.

(30) Foreign Application Priority Data

Jul. 13, 2016 (KR) .................. 10-2016-0088706

(51) Int. Cl.
*H01L 49/02* (2006.01)
*H01L 27/108* (2006.01)
*H01L 27/10* (2006.01)

(52) U.S. Cl.
CPC ........... *H01L 28/75* (2013.01); *H01L 27/101* (2013.01); *H01L 27/10805* (2013.01); *H01L 27/10808* (2013.01); *H01L 27/10811* (2013.01); *H01L 27/10814* (2013.01); *H01L 27/10847* (2013.01); *H01L 27/10852* (2013.01); *H01L 27/10855* (2013.01)

(58) Field of Classification Search
CPC ............... H01L 28/75; H01L 27/10808; H01L 27/10852; H01L 27/101; H01L 27/10805; H01L 27/10811; H01L 27/10814; H01L 27/10847; H01L 27/10855
See application file for complete search history.

(56) References Cited

U.S. PATENT DOCUMENTS

| | | | |
|---|---|---|---|
| 6,346,746 B1 | 2/2002 | Agarwal | |
| 6,628,064 B1 * | 9/2003 | Miura | .................. H01J 29/868 313/479 |
| 6,793,969 B2 | 9/2004 | Shimogaki et al. | |
| 6,933,021 B2 | 8/2005 | Chou et al. | |
| 7,205,192 B2 | 4/2007 | Kweon | |
| 8,343,844 B2 | 1/2013 | Kim et al. | |

(Continued)

FOREIGN PATENT DOCUMENTS

| | | |
|---|---|---|
| KR | 10-0465854 B1 | 5/2005 |
| KR | 10-2009-0070910 A | 7/2009 |
| KR | 10-2009-0107293 A | 10/2009 |

*Primary Examiner* — Feifei Yeung Lopez
(74) *Attorney, Agent, or Firm* — Lee IP Law, P.C.

(57) ABSTRACT

A semiconductor device includes a lower electrode structure, an upper electrode structure, and a dielectric layer between the lower and upper electrode structures and on side surfaces and an upper surface of the lower electrode structure. The lower electrode structure includes a first lower electrode pattern having a cylindrical shape, a barrier layer on the first lower electrode pattern, and a second lower electrode pattern in a space defined by the barrier layer.

18 Claims, 41 Drawing Sheets

(56) References Cited

U.S. PATENT DOCUMENTS

| | | |
|---|---|---|
| 8,637,362 B2 | 1/2014 | Forbes |
| 2002/0179954 A1 | 12/2002 | Joo et al. |
| 2003/0003641 A1 | 1/2003 | Cho et al. |
| 2004/0150021 A1* | 8/2004 | Nishikawa ........ H01L 27/10855 257/296 |
| 2004/0155276 A1* | 8/2004 | Iwasaki ............ H01L 21/28185 257/301 |
| 2005/0167725 A1 | 8/2005 | Nagano et al. |
| 2006/0263977 A1* | 11/2006 | Kim ........................ H01L 28/84 438/253 |
| 2006/0283716 A1* | 12/2006 | Hafezi ..................... C25D 3/38 205/291 |
| 2007/0066015 A1 | 3/2007 | Park et al. |
| 2010/0197089 A1 | 8/2010 | Kim et al. |
| 2015/0137254 A1 | 5/2015 | Gealy et al. |
| 2016/0380044 A1* | 12/2016 | Lee ........................ H01L 28/75 257/306 |

* cited by examiner

SEMICONDUCTOR DEVICE

CROSS-REFERENCE TO RELATED APPLICATION

Korean Patent Application No. 10-2016-0088706, filed on Jul. 13, 2016, and entitled, "Semiconductor Device," is incorporated by reference herein in its entirety.

BACKGROUND

1. Field

One or more embodiments described herein relate to a semiconductor device.

2. Description of the Related Art

Various types of semiconductor memory devices have been developed. One example is a dynamic random access memory (DRAM). Attempts have been made to increase the integration of DRAMs. However, these attempts have reduced the memory cell area and/or have produced other drawbacks.

SUMMARY

In accordance with one or more embodiments, a semiconductor device includes a substrate, a lower electrode structure above the substrate and extending in a direction crossing an upper surface of the substrate, a dielectric layer on side surfaces and an upper surface of the lower electrode structure, and an upper electrode structure on the dielectric layer, wherein the lower electrode structure includes a first lower electrode pattern having a cylindrical shape, a barrier layer on the first lower electrode pattern, and a second lower electrode pattern in a space defined by the barrier layer.

In accordance with one or more other embodiments, a semiconductor device includes a substrate, contact plugs in an interlayer insulation pattern layer on the substrate, lower electrode structures above the substrate, abutting respective ones of the contact plugs, and extending in a direction crossing an upper surface of the substrate, supports connecting adjacent lower electrode structures, from among the lower electrode structures, to each other, a dielectric layer along external surfaces of the lower electrode structures and the supports, and an upper electrode structure on the dielectric layer, wherein each of the lower electrode structures includes a first lower electrode pattern having a cylindrical shape, a barrier layer on the first lower electrode pattern, and a second lower electrode pattern in a space defined by the barrier layer.

In accordance with one or more other embodiments, a capacitor includes a lower and upper electrode structures and a dielectric layer between the lower and upper electrode structures, wherein the lower electrode structure includes a first electrode pattern, a second electrode pattern, and a barrier layer, the barrier layer on the first electrode pattern and the second electrode pattern in a space defined by the barrier layer.

In accordance with one or more embodiments, a semiconductor device includes: a substrate; a lower electrode structure above the substrate and extending in a direction crossing an upper surface of the substrate; a dielectric layer on side surfaces and an upper surface of the lower electrode structure; and an upper electrode structure on the dielectric layer, wherein the lower electrode structure includes: a first lower electrode pattern having a cylindrical shape including a side wall and a floor portion; a barrier layer on an inner surface of the first lower electrode pattern; and a second lower electrode pattern in a space defined by the barrier layer, wherein the first lower electrode pattern includes: a first portion including a first metal element; and a second portion including an oxide of the first portion.

In accordance with one or more embodiments, a semiconductor device includes: a substrate; a lower electrode structure above the substrate and extending in a direction crossing an upper surface of the substrate; a dielectric layer on side surfaces and an upper surface of the lower electrode structure; and an upper electrode structure on the dielectric layer, wherein the lower electrode structure includes: a first lower electrode pattern having a cylindrical shape including a side wall and a floor portion; a barrier layer on an inner surface of the first lower electrode pattern; and a second lower electrode pattern in a space defined by the barrier layer and having a cylindrical shape including a side wall and a floor portion, wherein an outer side wall of the first lower electrode pattern is covered by an interlayer insulation layer.

In accordance with one or more embodiments, a semiconductor device includes: a substrate; a first interlayer insulation layer on the substrate and exposing an upper surface of a contact plug; a first lower electrode pattern having a cylindrical shape including a floor portion and a side wall, wherein the floor portion is connected to the contact plug, and the side wall extends in a direction crossing the floor portion; a barrier layer extending along an inner side wall of the first lower electrode pattern; a second lower electrode pattern in a space defined by the barrier layer; a dielectric layer contacting upper surfaces of the first lower electrode pattern, the barrier layer, and the second lower electrode pattern; and an upper electrode structure facing the second lower electrode pattern with the dielectric layer therebetween, wherein the first lower electrode pattern includes: a first portion having a first resistance; and a second portion having a second resistance 10 times or greater compared to the first resistance.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
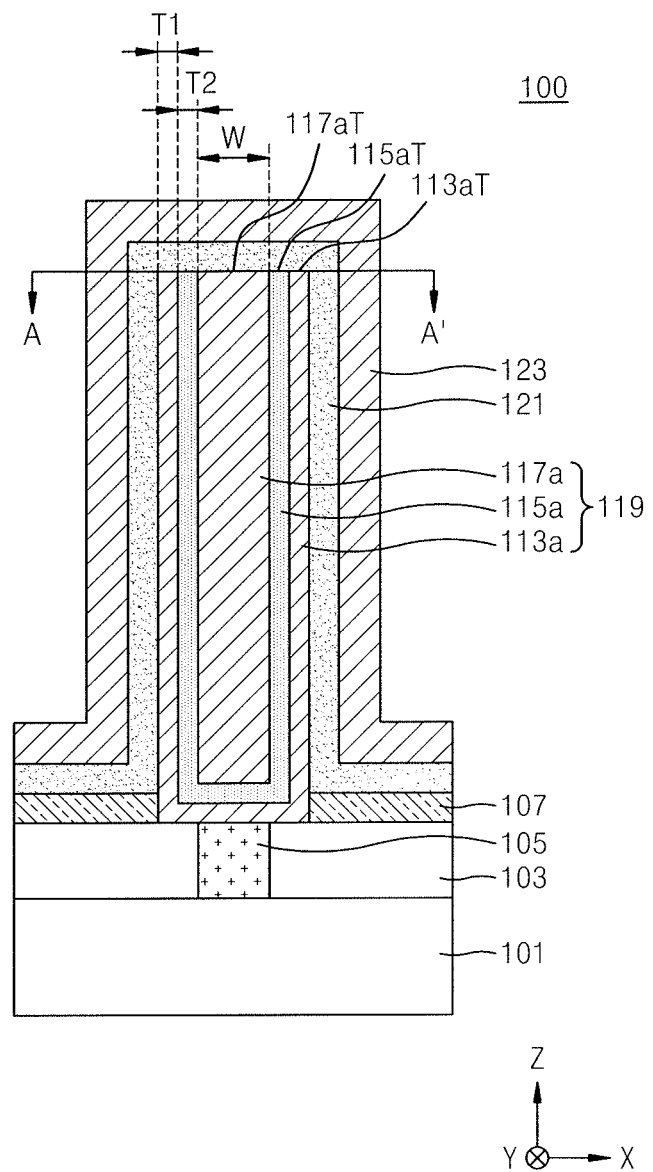
FIG. 1A illustrates an embodiment of a semiconductor device.
Figure 1B:
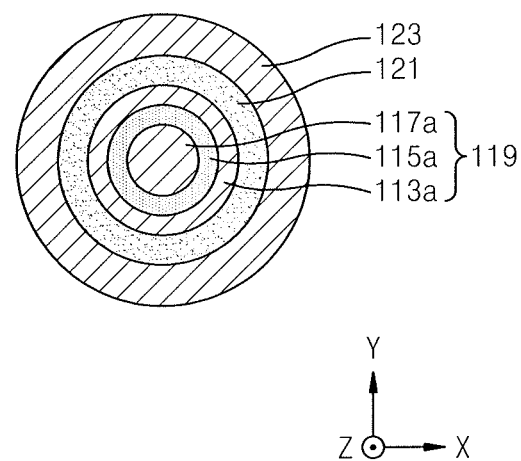
FIG. 1B illustrates a view along section line A-A' in FIG. 1A.

FIG. 1A is a cross-sectional view an embodiment of a semiconductor device 100, and FIG. 1B is a cross-sectional view taken along line A-A' in FIG. 1A Referring to FIGS. 1A and 1B, the semiconductor device 100 may include a substrate 101, a lower electrode structure 119 above the substrate 101, a dielectric layer 121 on side surfaces and an upper surface of the lower electrode structure 119, and an upper electrode structure 123 on the dielectric layer 121. The lower electrode structure 119 may include a first lower electrode pattern 113a having a predetermined (e.g., cylinder) shape, a barrier layer 115a on the first lower electrode pattern 113a, and a second lower electrode pattern 117a in a space defined by the barrier layer 115a. Electrode pattern 113a may have a different shape in another embodiment.

The barrier layer 115a may prevent the occurrence of a bridge between adjacent lower electrode structures 119 and an increase in node resistance of the lower electrode structure 119, by suppressing excessive oxidation of the lower electrode structure 119 during a process of forming the dielectric layer 121.

An interlayer insulation layer 103 may be on the substrate 101, and a contact plug 105 may penetrate the interlayer insulation layer 103 and may be electrically connected to the substrate 101. The substrate 101 may be a semiconductor substrate, for example, a substrate including one or more semiconductor materials of Si, Ge, SiGe, GaP, GaAs, SiC, SiGeC, InAs, or InP, a silicon-on-insulator (SOI) substrate, or the like. The substrate 101 may further include a transistor and/or lines. The contact plug 105 may be connected to the transistor and/or the lines of the substrate 101. The contact plug 105 may include, for example, doped polysilicon or a metal material.

An etch stop layer 107 may be on the interlayer insulation layer 103 and may have a shape and/or structure which selectively exposes an upper surface of the contact plug 105.

The lower electrode structure 119 may abut the upper surface of the contact plug 105 and extend in a direction (direction Z) perpendicular to an upper surface of the substrate 101. The lower electrode structure 119 may include the first lower electrode pattern 113a having a predetermined (e.g., cylindrical) shape, the barrier layer 115a on the first lower electrode pattern 113a, and the second lower electrode pattern 117a in a space defined by the barrier layer 115a. The thickness T1 of the first lower electrode pattern 113a may be less than a width W of the second lower electrode pattern 117a. The thickness T2 of the barrier layer 115a may be less than the width W of the second lower electrode pattern 117a. In one example, the thickness T1 of the first lower electrode pattern 113a may be about 1 to about 30 Å, the thickness T2 of the barrier layer 115a may be about 1 to about 30 Å, and the width W of the second lower electrode pattern 117a may be about 10 to about 300 Å.

The barrier layer 115a may block $O_3$, which is a reaction gas of the formation process of the dielectric layer 121. As a result, $O_3$ may not intrude into the second lower electrode pattern 117a. Accordingly, a region of the second lower electrode pattern 117a that is oxidized by the reaction gas $O_3$ may be decreased. Thus, node resistance increase or a bridge phenomenon between adjacent lower electrode structures caused by volume expansion may be suppressed. At the same time, the first lower electrode pattern 113a thinly formed on the barrier layer 115a may provide a base to allow for deposition of the dielectric layer 121. For example, because crystallinity, adhesiveness, and the like, of the dielectric layer 121 are determined according to a lower layer of the dielectric layer 121, the dielectric layer 121 with excellent properties may be formed by providing the first lower electrode pattern 113a having metallicity as the lower layer of dielectric layer 121.

Even in this case, the first lower electrode pattern 113a may be partially oxidized by the reaction gas $O_3$. However, since the thickness T1 of the first lower electrode pattern 113a is less than the width W of the second lower electrode pattern 117a, an increase in the overall resistance of the lower electrode structure 119 and the bridge phenomenon caused by volume expansion may be suppressed.

The barrier layer 115a may be metal silicon nitride. For example, the barrier layer 115a may be TiSiN, TaSiN, WSiN, ZrSiN, AlSiN, or the like. In some embodiments, the barrier layer 115a may have a silicon concentration gradient in a thickness direction of the barrier layer 115a. For example, the concentration of silicon in the barrier layer 115a may decrease in a direction from a first interface between the first lower electrode pattern 113a and the barrier layer 115a to a second interface between the barrier layer 115a and the second lower electrode pattern 117a.

In some embodiments, the barrier layer 115a may have a multilayer structure in which a silicon concentration of an upper barrier layer may be lower than that of a lower barrier layer. In some embodiments, the barrier layer 115a may have a structure including a metal nitride layer and a silicon nitride layer which are stacked alternately at least once.

The first and second lower electrode patterns 113a and 117a include metal or metal nitride. For example, each of the first and second lower electrode patterns 113a and 117a may include at least one of Ti, TiN, W, WN, Ta, TaN, HfN, ZrN, TiAlN, TaSiN, TiSiN, TaAlN, or the like. Each of the first and second lower electrode patterns 113a and 117a may have a single-layer structure or a multilayer structure.

The dielectric layer 121 may be on the side surfaces and the upper surface of the lower electrode structure 119. A top surface 113aT of the first lower electrode pattern 113a, a top surface 115aT of the barrier layer 115a, and a top surface 117aT of the second lower electrode pattern 117a may be at the same level as one another. The dielectric layer 121 may cover the top surface 113aT of the first lower electrode pattern 113a, the top surface 115aT of the barrier layer 115a, and the top surface 117aT of the second lower electrode pattern 117a. In some embodiments, the second lower electrode pattern 117a may cover the top surface 113aT of the first lower electrode pattern 113a and the top surface 115aT of the barrier layer 115a.

The dielectric layer 121 may have a single layer structure including a tantalum oxide film ($Ta_2O_5$), an aluminum oxide film ($Al_2O_3$), or a titanium oxide film (TiO) or may have a multilayer structure including tantalum oxide film/titanium oxide film, aluminum oxide film/titanium oxide film, or the like.

The upper electrode structure 123 may be on the dielectric layer 121. The upper electrode structure 123 may include metal or metal nitride. For example, the upper electrode structure 123 may include at least one of Ti, TiN, W, WN, Ta, TaN, HfN, ZrN, TiAlN, TaSiN, TiSiN, TaAlN, or the like. The upper electrode structure 123 may have a single-layer structure or a multilayer structure.

Figure 2:
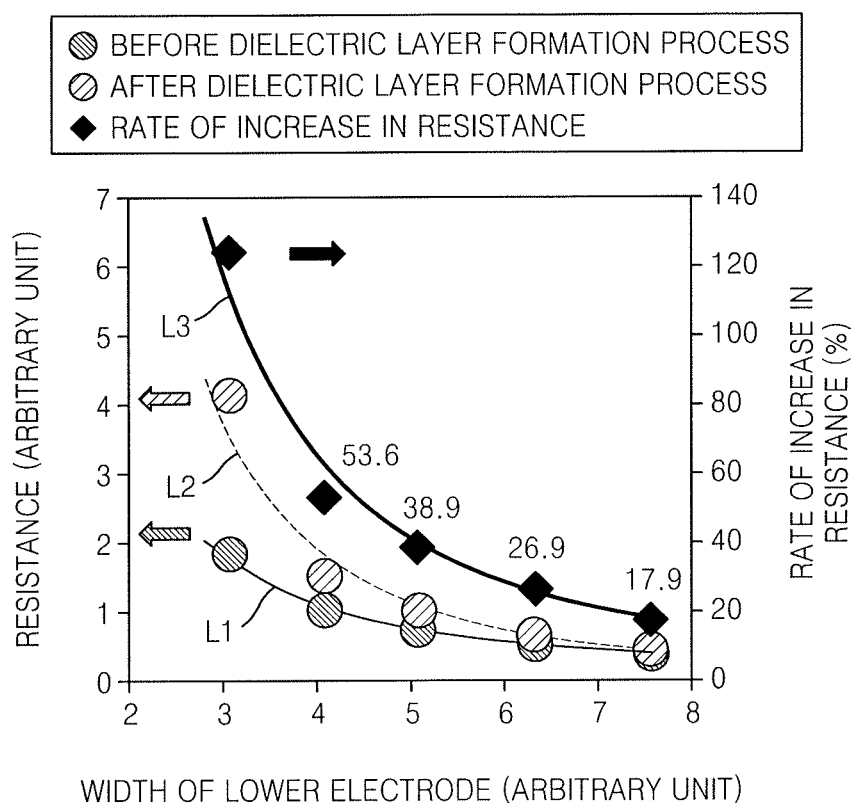
FIG. 2 illustrates an example of a rate of increase in resistance based on the width of a lower electrode before and after a dielectric layer formation process.
Figure 3:
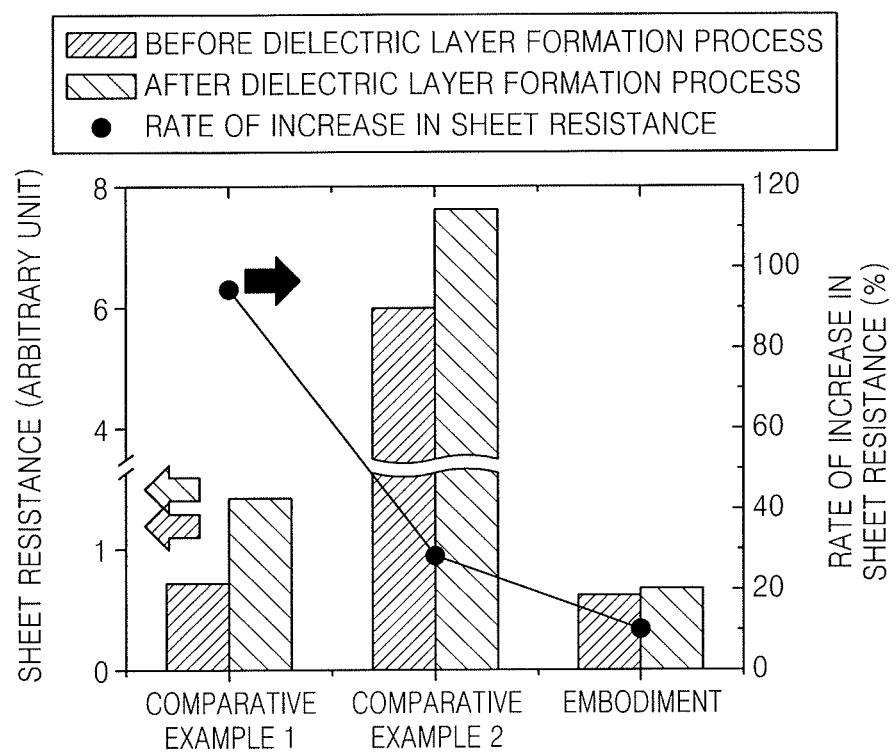
FIG. 3 illustrates examples of a rate of increase in resistance based on a lower electrode structure before and after a dielectric layer formation process.

FIG. 2 is a graph showing an example a rate of increase in resistance based on the width of a lower electrode of a proposed semiconductor device before and after a dielectric layer formation process. FIG. 3 is a graph showing examples of rates of increase in sheet resistance according to the lower electrode structures of comparative examples and an embodiment before and after a dielectric layer formation process.

When the resistance of the lower electrode of a capacitor increases, node resistance of the capacitor increases. Thus, performance of a semiconductor device may degrade. A reaction gas introduced during a dielectric layer formation process may oxidize the lower electrode and increase the resistance of the lower electrode.

In FIG. 2, trend line 1 L1 corresponds to resistance based on the width of a lower electrode before a dielectric layer formation process. Trend line 2 L2 corresponds to resistance based on the width of a lower electrode after the dielectric layer formation process. Trend line 3 L3 corresponds to the rate of increase in resistance based on the width of a lower electrode before and after the dielectric layer formation process.

Referring to the trend line 1 L1, resistance increases as the width of the lower electrode decreases. Accordingly, as the semiconductor device tends to be integrated, a resistance increase of the lower electrode is unavoidable and a structure for suppressing additional resistance increase is necessary.

Referring to the trend line 2 L2, after the process of forming a dielectric layer on the lower electrode, resistance increases in every width range of the lower electrode. Also, the width of resistance increase greatly increases as the width of the lower electrode decreases.

Referring to the trend line 3 L3, the rate of increase in resistance before and after the dielectric layer formation process increases as the width of the lower electrode decreases. When the width of the lower electrode is about 7.5, the rate of increase in resistance after the dielectric layer formation process is about 17.9%. When the width of the lower electrode is about 3, the rate of increase in resistance after the dielectric layer formation process increases to about 124.6%. Thus, as the width of the lower electrode tends to decrease, oxidation of the lower electrode caused by the dielectric layer formation process may affect resistance of the lower electrode more significantly.

Referring to FIG. 3, comparative example 1 corresponds to a lower electrode including a metal material, and more particularly, TiN. Comparative example 2 corresponds to a lower electrode including a barrier layer material, and more particularly, TiSiN. The example embodiment corresponds to a lower electrode structure in FIGS. 1A and 1B, namely, a lower electrode structure including a first lower electrode pattern including TiN, a barrier layer including TiSiN on the first lower electrode pattern, and a second lower electrode pattern including TiN on the barrier layer. The thickness of the first lower electrode pattern may be less than the width of the second lower electrode pattern.

Referring to comparative example 1, the sheet resistance of the lower electrode before a dielectric layer formation process is about 0.70, and the sheet resistance of the lower electrode after the dielectric layer formation process increases to about 1.38. Thus, the rate of increase in sheet resistance is about 97%. Thus, the lower electrode is oxidized by a reaction gas $O_3$ introduced during the dielectric layer formation process. Thus, sheet resistance of the lower electrode may greatly increase. In this case, the sheet resistance far exceeds a resistance level that is planned in semiconductor device design, and thus reliability of a semiconductor device may degrade.

Referring to comparative example 2, the sheet resistance of the lower electrode before a dielectric layer formation process is about 6.00, and the sheet resistance of the lower electrode after the dielectric layer formation process is about 7.50. Thus, sheet resistance of the material itself is very high. Accordingly, apart from the rate of increase in sheet resistance caused by the dielectric layer formation process, the lower electrode corresponding to comparative example 2 may be hard to use in a semiconductor device requiring low-resistive node resistance.

Referring to the example embodiment, the sheet resistance of the lower electrode before a dielectric layer formation process is about 0.60, and the sheet resistance of the lower electrode after the dielectric layer formation process increases to about 0.66. Thus, the rate of increase in sheet resistance is about 10%. As a result, the resistance level planned in semiconductor device design may be relatively stably maintained, and reliability of a semiconductor device may be therefore be obtained.

Moreover, a reaction gas $O_3$ introduced during the dielectric layer formation process of the example embodiment may mainly react with the first lower electrode pattern corresponding to a surface of the lower electrode structure, and intrusion of the reaction gas $O_3$ into the second lower electrode pattern may be suppressed by the barrier layer. Accordingly, oxidization of the second lower electrode pattern occupying most of the lower electrode structure is suppressed. Thus, the rate of increase in overall sheet resistance of the lower electrode structure may be very low.

Referring to FIGS. 1A and 1B, in some embodiments, a first sheet resistance of the first lower electrode pattern 113a may be about twice as much as a second sheet resistance of the second lower electrode pattern 117a or greater. The first sheet resistance of the first lower electrode pattern 113a may correspond to about 1.38, which is the sheet resistance of the lower electrode after the dielectric layer formation process in comparative example 1. The second sheet resistance of the second lower electrode pattern 117a may correspond to a numerical value less than about 0.66, which is the sheet resistance of the lower electrode after the dielectric layer formation process in the embodiment.

According to the graph of FIG. 3, the first sheet resistance of the first lower electrode pattern 113a may be about 2.1 times greater than the second sheet resistance of the second lower electrode pattern 117a. The difference in sheet resistance between the first lower electrode pattern 113a and the second lower electrode pattern 117a may be generated by oxidation caused by the reaction gas $O_3$. Since the second lower electrode pattern 117a has the reaction gas $O_3$ blocked by the barrier layer 115a, and thus oxidation of the second lower electrode pattern 117a is suppressed, the second lower electrode pattern 117a may have a sheet resistance less than that of the first lower electrode pattern 113a.

Figure 4A:
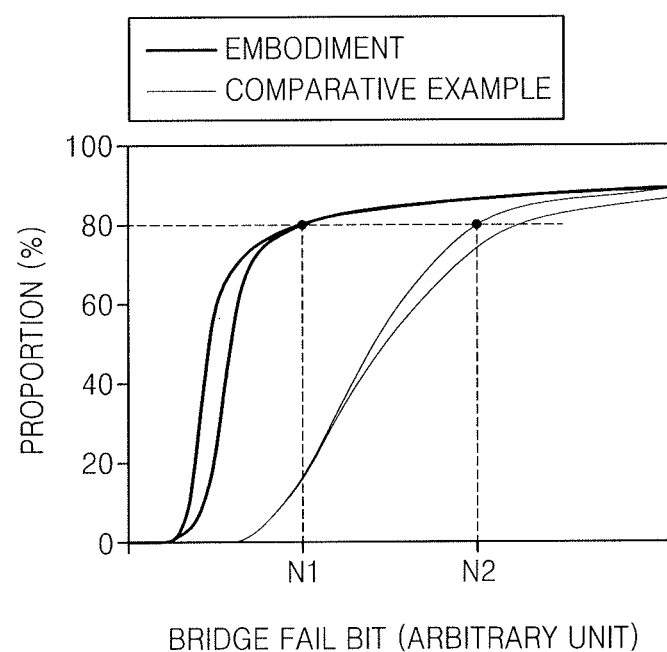
FIG. 4A illustrates examples of a proportion of semiconductor devices based on a number of bridge fail bits.
Figure 4B:
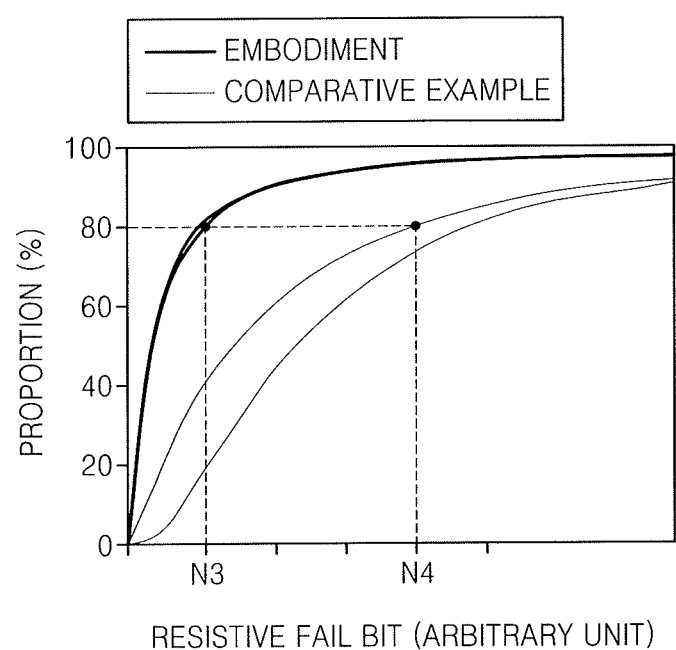
FIG. 4B illustrates an example of a proportion of semiconductor devices based on a number of resistive fail bits.

FIG. 4A is a graph showing proportions of memory chips based on numbers of bridge fail bits in memory chips for comparative example of a semiconductor device and an example embodiment of the semiconductor device 100 in FIGS. 1A and 1B. FIG. 4B is a graph showing proportions of memory chips based on numbers of resistive fail bits for the comparative example and the example embodiment.

Referring to FIG. 4A, in the example embodiment, about 80% of the total memory chips have bridge fail bits in a first fail bit number N1 or less. On the other hand, in the comparative example, the proportion of memory chips having bridge fail bits in the first fail bit number N1 or less in the total memory chips is merely about 30%. In the comparative example, about 80% of the total memory chips is in a range equal to or less than a second fail bit number N2, which corresponds to about twice the first fail bit number N1. Thus, in a semiconductor device including a lower electrode structure corresponding to the example embodiment, a bridge phenomenon between lower electrode structures is suppressed and the frequency of occurrence of bridge fail bits is low. Thus, a memory chip having high reliability may be provided.

Referring to FIG. 4B, in the example embodiment, about 80% of the total memory chips have resistive fail bits in a first fail bit number N3 or less. On the other hand, in the comparative example, the proportion of memory chips having resistive fail bits in the first fail bit number N3 or less in the total memory chips is merely about 20% or about 40%. In the comparative example, about 80% of the total memory chips is in a range equal to or less than a second fail bit number N4, which is about quadruple the first fail bit number N3. Thus, in a semiconductor device including a lower electrode structure corresponding to the example embodiment, the increase in resistance of the lower electrode structure is suppressed and the frequency of occurrence of resistive fail bits is low. Thus, a memory chip having high reliability may be provided.

Figure 5A:
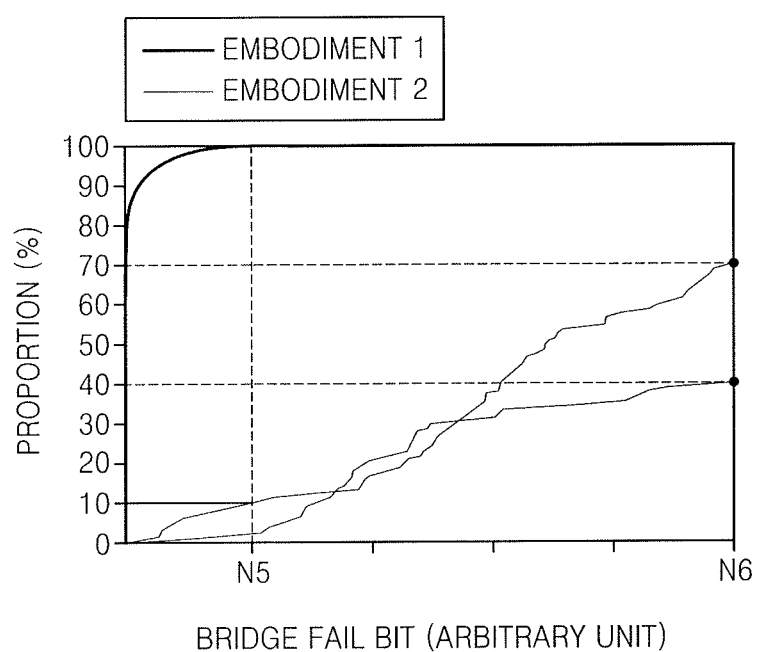
FIG. 5A illustrates examples of a proportion of semiconductor devices based on a number of bridge fail bits in ones that have different widths of second lower electrode patterns.
Figure 5B:
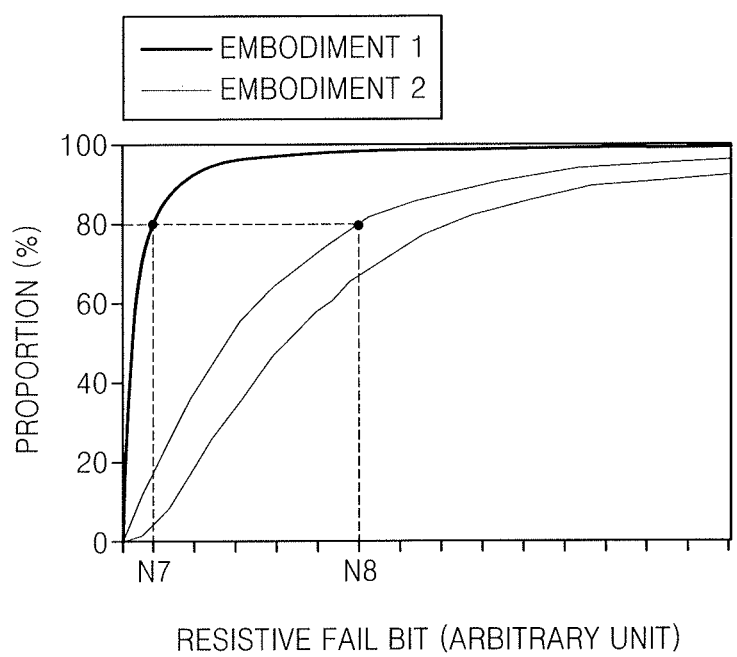
FIG. 5B illustrates examples of a proportion of semiconductor devices based on a number of resistive fail bits.

FIG. 5A is a graph showing proportions of memory chips based on numbers of bridge fail bits in memory chips for different embodiments of the semiconductor device 100 in FIGS. 1A and 1B. FIG. 5B is a graph showing proportions of memory chips based on numbers of resistive fail bits for different embodiments. In FIGS. 5A and 5B, embodiment 1 may be memory chips including semiconductor devices having second lower electrode patterns that are about 40 Å in width, and embodiment 2 may be memory chips including semiconductor devices having second lower electrode patterns that are about 20 Å in width.

Referring to FIG. 5A, in embodiment 1, the total memory chips have bridge fail bits in a first fail bit number N5 or less.

In embodiment 2, the proportion of memory chips having bridge fail bits in the first fail bit number N5 or less in the total memory chips is merely about 10% or less. In embodiment 2, about 40% or about 70% of the total memory chips is in a range equal to or less than a second fail bit number N6, which is about quintuple the first fail bit number N5. Thus, in the lower electrode structure 119 in the semiconductor device 100 of FIGS. 1A and 1B, when the width W of the second lower electrode pattern 117a is about 40 Å or greater, a bridge phenomenon between lower electrode structures 119 may be suppressed and the frequency of occurrence of bridge fail bits is low. Thus, a memory chip with high reliability may be provided.

Referring to FIG. 5B, in embodiment 1, 80% of the total memory chips has resistive fail bits in a first fail bit number N7 or less. In embodiment 2, the proportion of memory chips having resistive fail bits in the first fail bit number N7 or less in the total memory chips is merely about 20%. In embodiment 2, about 80% of the total memory chips is in a range equal to or less than a second fail bit number N8, which is about sextuple the first fail bit number N7. Thus, in the lower electrode structure 119 in the semiconductor device 100 of FIGS. 1A and 1B, when the width W of the second lower electrode pattern 117a is about 40 Å or greater, the increase in resistance of the lower electrode structure 119 is suppressed. Accordingly, the frequency of occurrence of resistive fail bits is low. Thus, a memory chip having high reliability may be provided.

Figure 6:
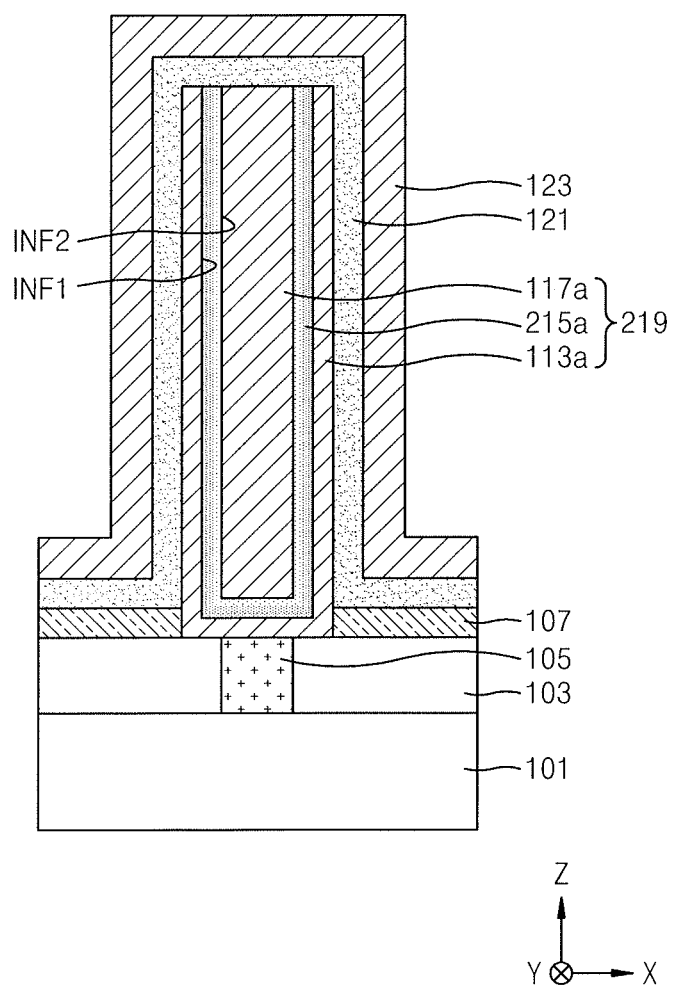
FIG. 6 illustrates another embodiment of a semiconductor device.

FIG. 6 is a cross-sectional view of another embodiment of a semiconductor device 200. The semiconductor device 200 is similar to the semiconductor device 100 in FIGS. 1A and 1B, except for a silicon concentration gradient in a barrier layer 215a.

Referring to FIG. 6, the semiconductor device 200 may include the substrate 101, a lower electrode structure 219 above the substrate 101, the dielectric layer 121 on side surfaces and an upper surface of the lower electrode structure 219, and the upper electrode structure 123 on the dielectric layer 121. The lower electrode structure 219 may include the first lower electrode pattern 113a having a predetermined (e.g., cylindrical) shape, the barrier layer 215a on the first lower electrode pattern 113a, and the second lower electrode pattern 117a in a space defined by the barrier layer 215a.

The barrier layer 215a may have a silicon concentration gradient in which the concentration of silicon in the barrier layer 215a decreases in a direction from a first interface INF1 between the first lower electrode pattern 113a and the barrier layer 215a to a second interface INF2 between the barrier layer 215a and the second lower electrode pattern 117a. A region of the barrier layer 215a that abuts the first interface INF1 has a high silicon concentration, and thus may defend against intrusion of a reaction gas $O_3$ introduced for a dielectric layer formation process. At the same time, a region of the barrier layer 215a that abuts the second interface INF2 has a low silicon concentration, and thus may control resistance of the lower electrode structure 219 itself not to be increased by the barrier layer 215a.

In some embodiments, the barrier layer 215a may be metal silicon nitride having a silicon concentration gradient in a thickness direction of the barrier layer 215a. For example, the barrier layer 215a may be TiSiN, TaSiN, WSiN, ZrSiN, AlSiN, or the like, having a silicon concentration gradient in a thickness direction of the barrier layer 215a. The silicon concentration gradient may be formed, for example, by adjusting flow of a silicon source for forming the barrier layer 215a. For example, the silicon concentration gradient may be formed by increasing flow of SiH$_4$ or SiH$_2$Cl$_2$, which is a silicon source, during an early period of forming the barrier layer 215a on the first lower electrode pattern 113a and gradually decreasing the flow of the silicon source according to time.

Figure 7:
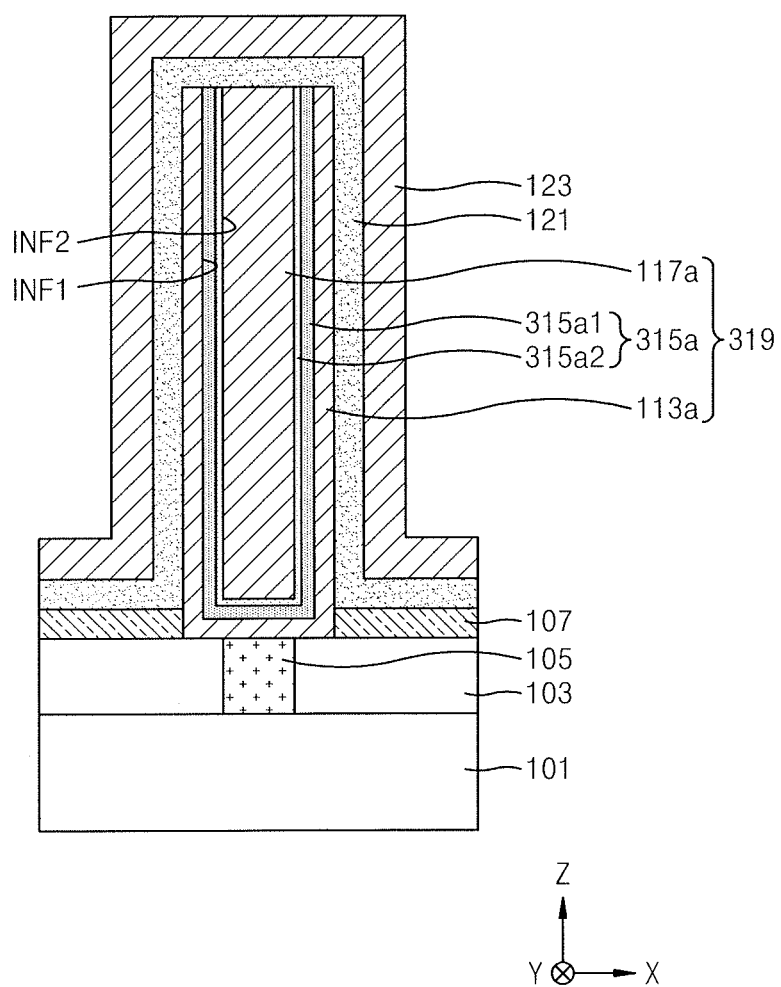
FIG. 7 illustrates another embodiment of a semiconductor device.

FIG. 7 is a cross-sectional view of another embodiment of a semiconductor device 300. The semiconductor device 300 is similar to the semiconductor device 100 of FIGS. 1A and 1B, except for a barrier layer 315a which has a multilayer structure.

Referring to FIG. 7, the semiconductor device 300 may include the substrate 01, a lower electrode structure 319 above the substrate 101, the dielectric layer 121 on side surfaces and an upper surface of the lower electrode structure 319, and the upper electrode structure 123 on the dielectric layer 121. The lower electrode structure 319 may include the first lower electrode pattern 113a having a predetermined (e.g., cylindrical) shape, the barrier layer 315a on the first lower electrode pattern 113a, and the second lower electrode pattern 117a in a space defined by the barrier layer 315a.

The barrier layer 315a may include a structure in which a lower barrier layer 315a1 and an upper barrier layer 315a2 are stacked in the stated order. The lower barrier layer 315a1 may include metal silicon nitride having a first silicon concentration. The upper barrier layer 315a2 may include metal silicon nitride having a second silicon concentration lower than the first silicon concentration. The lower barrier layer 315a1 of the barrier layer 315a, which abuts the first interface INF1, has the first silicon concentration that is high and, thus, may effectively defend against intrusion of a reaction gas O$_3$ introduced for a dielectric layer formation process. At the same time, the upper barrier layer 315a2 of the barrier layer 315a, which abuts the second interface INF2, has the second silicon concentration that is low and, thus, may control resistance of the lower electrode structure 319 itself not to be increased by the barrier layer 315a.

Each of the lower barrier layer 315a1 and the upper barrier layer 315a2 may include at least one of TiSiN, TaSiN, WSiN, ZrSiN, or AlSiN and, for example, may include different materials from each other.

Figure 8A:
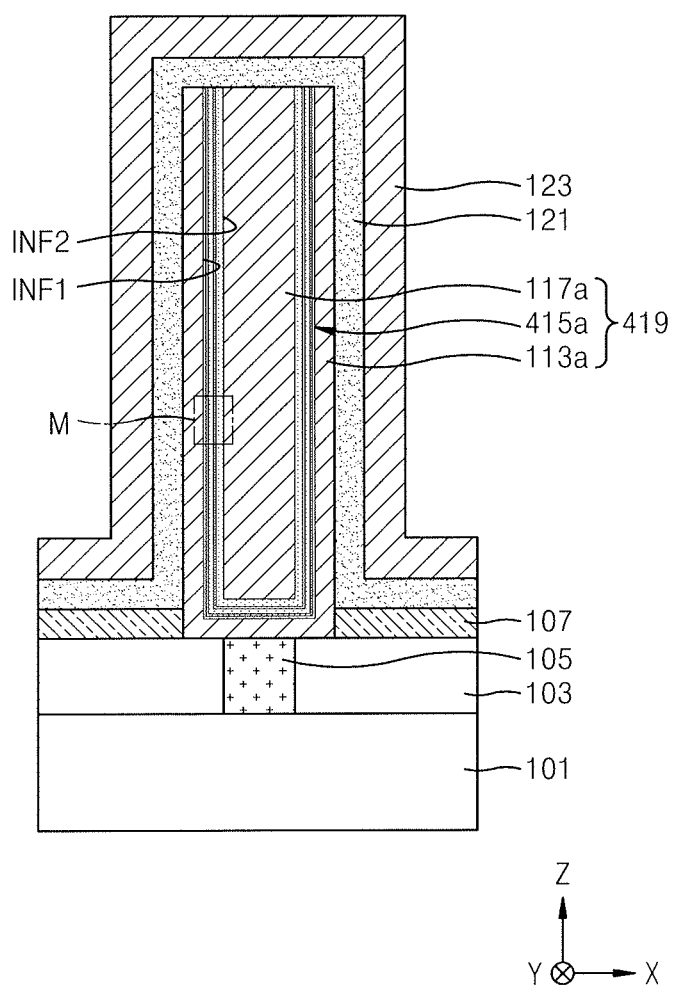
FIG. 8A illustrates a cross-sectional view of an embodiment of a semiconductor device.
Figure 8B:
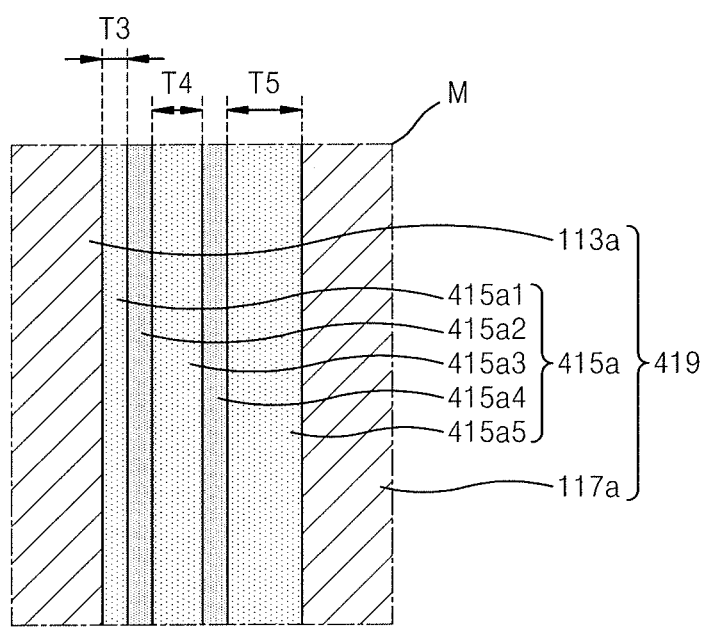
FIG. 8B illustrates an enlarged view of part M in FIG. 8A.

FIG. 8A is a cross-sectional view of another embodiment of a semiconductor device 400. FIG. 8B is an enlarged view of part M in FIG. 8A. The semiconductor device 400 is similar to the semiconductor device 100 of FIGS. 1A and 1B, except that a barrier layer 415a has a multilayer structure. For example, the barrier layer 415a of the semiconductor device 400 may have a structure in which a layer including no silicon and a layer including silicon are alternately stacked at least once.

Referring to FIGS. 8A and 8B, the semiconductor device 400 may include the substrate 101, a lower electrode structure 419 above the substrate 101, the dielectric layer 121 on side surfaces and an upper surface of the lower electrode structure 419, and the upper electrode structure 123 on the dielectric layer 121. The lower electrode structure 419 may include the first lower electrode pattern 113a having a predetermined (e.g., cylindrical) shape, the barrier layer 415a on the first lower electrode pattern 113a, and the second lower electrode pattern 117a in a space defined by the barrier layer 415a.

The barrier layer 415a may have a multilayer structure in which a layer including no silicon and a layer including silicon are alternately stacked at least once. In some embodiments, the barrier layer 415a may include a first metal nitride layer 415a1, a first silicon nitride layer 415a2, a second metal nitride layer 415a3, a second silicon nitride layer 415a4, and a third metal nitride layer 415a5 stacked on the first lower electrode pattern 113a in the stated order. A first thickness T3 of the first metal nitride layer 415a1 may be less than a second thickness T4 of the second metal nitride layer 415a3. The second thickness T4 may be less than a third thickness T5 of the third metal nitride layer 415a5. A silicon concentration gradient in a thickness direction of the barrier layer 415a may appear according to thickness differences in the first to third metal nitride layers 415a1, 415a3, and 415a5 adjacent to the first and second silicon nitride layers 415a2 and 415a4. For example, the silicon concentration gradient may increase in a direction toward the first lower electrode pattern 113a of the barrier layer 415a. Such a silicon concentration gradient may effectively defend against intrusion of a reaction gas O$_3$ introduced for a dielectric layer formation process.

In FIGS. 8A and 8B, the barrier layer 415a includes five layers. In another embodiment, the barrier layer 415a may include two to four or six or more layers.

Figure 9A:
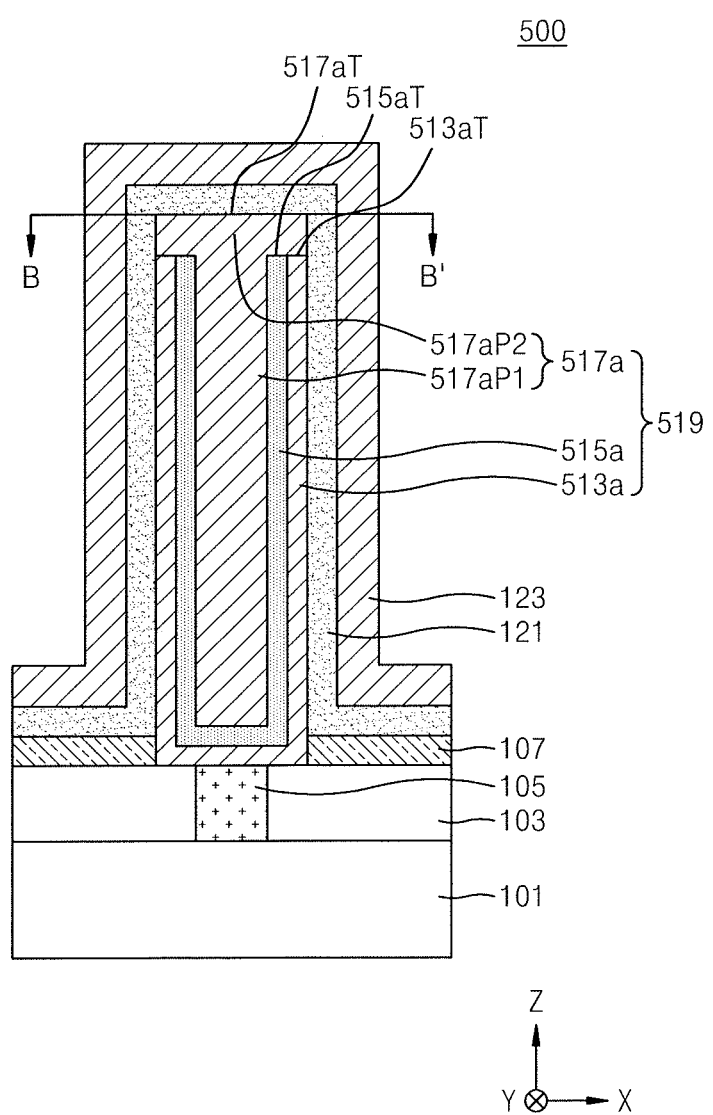
FIG. 9A illustrates a cross-sectional view of an embodiment of a semiconductor device.
Figure 9B:
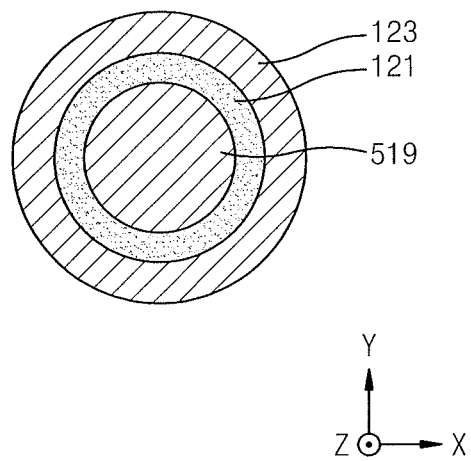
FIG. 9B illustrates a view along section line B-B' in FIG. 9A.

FIG. 9A is a cross-sectional view of another embodiment of a semiconductor device 500 according to embodiments. FIG. 9B is a cross-sectional view taken along line B-B' in FIG. 9A. The semiconductor device 500 is similar to the semiconductor device 100 of FIGS. 1A and 1B, except that a second lower electrode pattern 517a is on a first lower electrode pattern 513a and a barrier layer 515a.

Referring to FIGS. 9A and 9B, the semiconductor device 500 may include the substrate 101, a lower electrode structure 519 above the substrate 101, the dielectric layer 121 on side surfaces and an upper surface of the lower electrode structure 519, and the upper electrode structure 123 on the dielectric layer 121. The lower electrode structure 519 may include the first lower electrode pattern 513a having a predetermined (e.g., cylindrical) shape, the barrier layer 515a on the first lower electrode pattern 513a, and the second lower electrode pattern 517a.

In one embodiment, the second lower electrode pattern 517a may include a first portion 517aP1 filling a space defined by the barrier layer 515a and a second portion 517aP2 covering a top surface 513aT of the first lower electrode pattern 513a and a top surface 515aT of the barrier layer 515a. Thus, a top surface 517aT of the second lower electrode pattern 517a may be at a higher level than the top surface 513aT of the first lower electrode pattern 513a and the top surface 515aT of the barrier layer 515a. Cross-sections of the first lower electrode pattern 513a and the barrier layer 515a may be U-shaped, and a cross-section of the second lower electrode pattern 517a may be T-shaped. These cross-sectional shapes may be different in another embodiment.

The dielectric layer 121 covering the lower electrode structure 519 may abut side surfaces of the first lower electrode pattern 513a and side surfaces and an upper surface of the second portion 517aP2 of the second lower electrode pattern 517a and may not abut the barrier layer 515a.

Thus, in a cross-section of the lower electrode structure 519 taken long line B-B', only cross-sections of the second lower electrode pattern 517a, the dielectric layer 121, and the upper electrode structure 123 may be shown, and cross-sections of the first lower electrode pattern 513a and the barrier layer 515a may not be shown.

Figure 10:
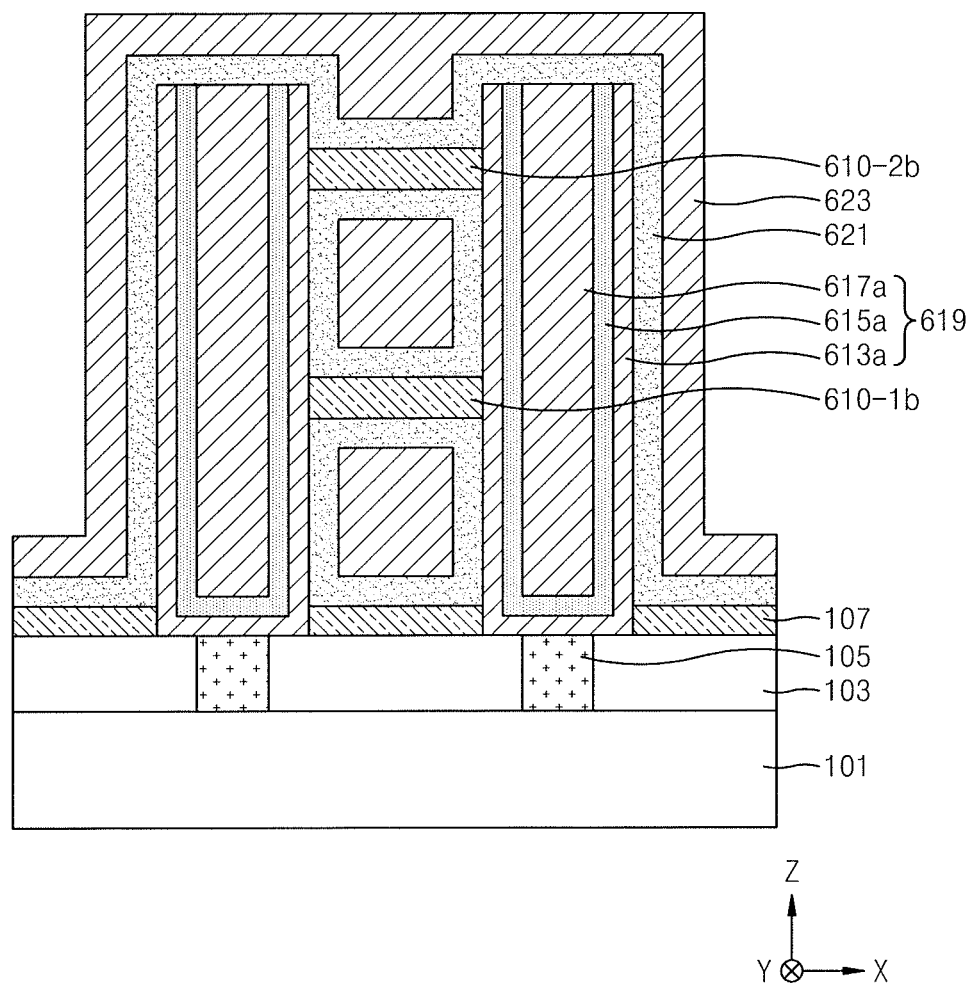
FIG. 10 illustrates another embodiment of a semiconductor device.

FIG. 10 is a cross-sectional view of another embodiment of a semiconductor device 600. The semiconductor device 600 is similar to the semiconductor device 100 of FIGS. 1A and 1B, except that supports 610-1b and 610-2b are between adjacent lower electrode structures 619, and a dielectric layer 621 and an upper electrode structure 623 extend along the lower electrode structures 619 and the supports 610-1b and 610-2b.

Referring to FIG. 10, the semiconductor device 600 may include the substrate 101, a plurality of lower electrode structures 619 above the substrate 101, the supports 610-1b and 610-2b connecting adjacent lower electrode structures 619 from among the plurality of lower electrode structures 619, the dielectric layer 621 extending along side surfaces and upper surfaces of the lower electrode structures 619 and the supports 610-1b and 610-2b, and the upper electrode structure 623 on the dielectric layer 621. Each of the lower electrode structures 619 may include a first lower electrode pattern 613a having a predetermined (e.g., cylindrical) shape, a barrier layer 615a on the first lower electrode pattern 613a, and a second lower electrode pattern 617a in a space defined by the barrier layer 615a.

The supports 610-1b and 610-2b may each include an insulating material. For example, each of the supports 610-1b and 610-2b may include a silicon nitride layer, a silicon oxide layer, or a silicon oxynitride layer. The supports 610-1b and 610-2b may prevent the lower electrode structures 619 from becoming slanted or falling down due to a high aspect ratio.

FIGS. 11A-11F illustrate various stages of an embodiment of a method for manufacturing the semiconductor device 100 in FIGS. 1A and 1B. Methods for manufacturing the semiconductor device 200 in FIG. 6, the semiconductor device 300 in FIG. 7, and the semiconductor device 400 in FIGS. 8A and 8B will also be described with reference to FIGS. 11A-11F.

Figure 11A:
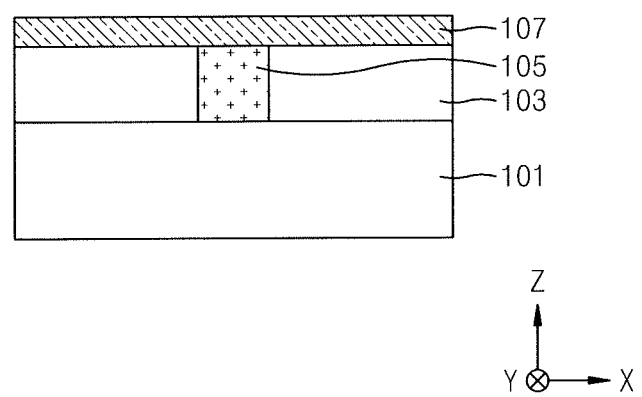
FIGS. 11A-11F illustrate various stages in an embodiment of a method for manufacturing the semiconductor device in FIGS. 1A and 1B.

Referring to FIG. 11A, a preliminary interlayer insulation layer may be formed on the substrate 101. The interlayer insulation layer 103, including a contact hole exposing a surface of the substrate 101, may be formed by etching a partial region of the preliminary interlayer insulation layer. The surface of the substrate 101 that is exposed to the bottom of the contact hole may be a surface of a transistor or a line in the substrate 101. The contact plug 105 may be formed by filling the contact hole with a conductive material and performing polishing to expose an upper surface of the interlayer insulation layer 103. The etch stop layer 107 may be formed on the interlayer insulation layer 103 and the contact plug 105, the etch stop layer 107 including an insulating material.

Figure 11B:
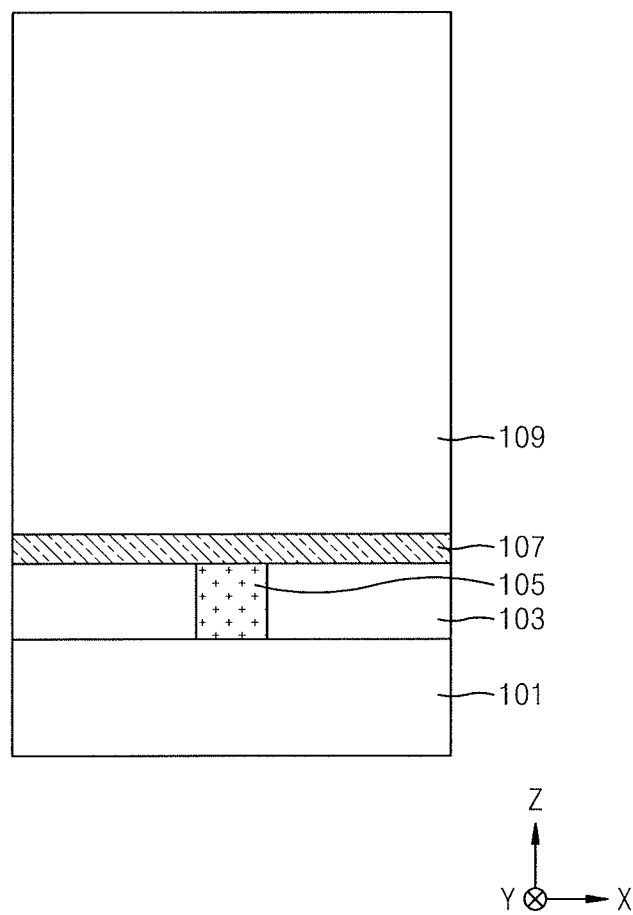

Referring to FIG. 11B, a mold layer 109 may be formed on the etch stop layer 107. The mold layer 109 may be a layer for forming the lower electrode structure 119 in FIGS. 1A and 1B. Accordingly, the thickness of the mold layer 109 may be formed to be the same as or higher than a height of the lower electrode structure 119. The mold layer 109 may include a material having high etch selectivity with respect to the etch stop layer 107. The mold layer 109 may include, for example, silicon oxide and may include BPSG, TOSZ, HDP, PE-TEOS, etc.

In FIG. 11B, the mold layer 109 has a single-layer structure. In another embodiment, mold layer 109 may have a multilayer structure of different materials. In some embodiments, instead of mold layer 109, a complex layer may be formed to include a sacrificial layer and a supporting layer alternately stacked at least once.

Figure 11C:
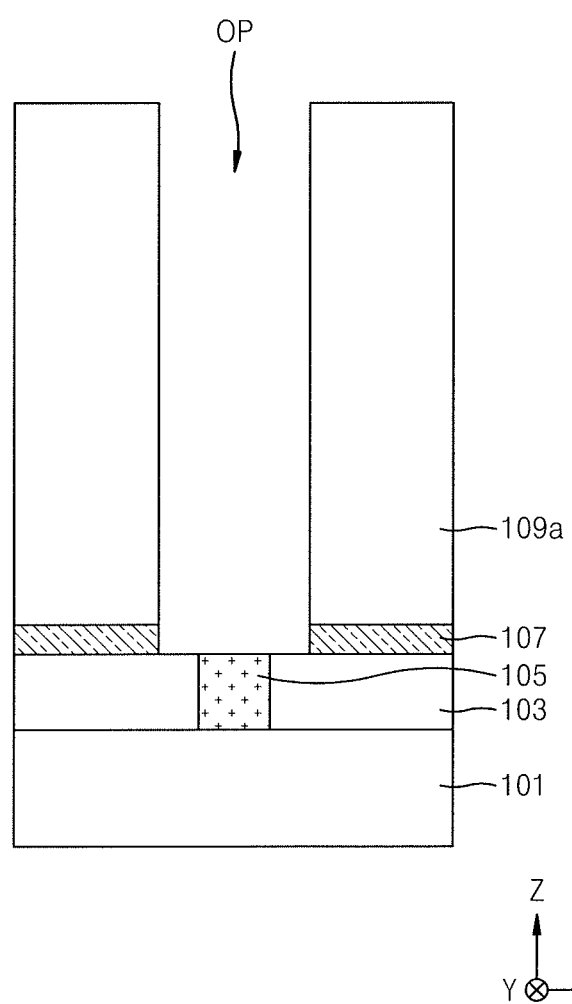

Referring to FIG. 11C, the mold layer 109 and the etch stop layer 107 of FIG. 11B may be partially etched to form an opening OP exposing an upper surface of the contact plug 105. Thus, an etch stop layer 107 and a mold layer pattern 109a exposing the upper surface of the contact plug 105 may be formed on the interlayer insulation layer 103 and the contact plug 105.

Figure 11D:
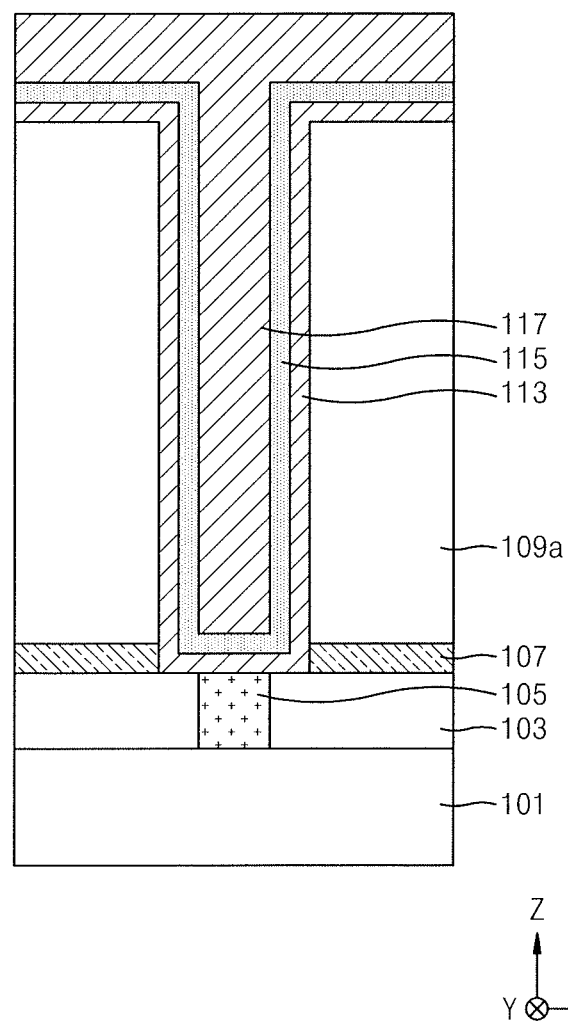

Referring to FIG. 11D, a first lower electrode layer 113 covering inner side surfaces and the bottom of the opening OP of FIG. 11C may be formed. The first lower electrode layer 113 may be formed, for example, by atomic layer deposition (ALD), chemical vapor deposition (CVD), or physical vapor deposition (PVD).

Afterwards, a preliminary barrier layer 115 may be formed on the first lower electrode layer 113. The preliminary barrier layer 115 may be formed by ALD, CVD, or PVD. The preliminary barrier layer 115 may be metal silicon nitride, for example, TiSiN, TaSiN, WSiN, ZrSiN, AlSiN, or the like. In some embodiments, when the preliminary barrier layer 115 is TiSiN, the preliminary barrier layer 115 may be formed by using $SiH_4$ or $SiH_2Cl_2$, which is a silicon source, $TiCl_4$, which is a titanium source, and $N_2$ or $NH_3$ gas, which is a nitrogen source.

Afterwards, a second lower electrode layer 117 may be formed on the preliminary barrier layer 115 to fill a space defined by the preliminary barrier layer 115. The second lower electrode layer 117 may be formed by ALD, CVD, or PVD.

Figure 11E:
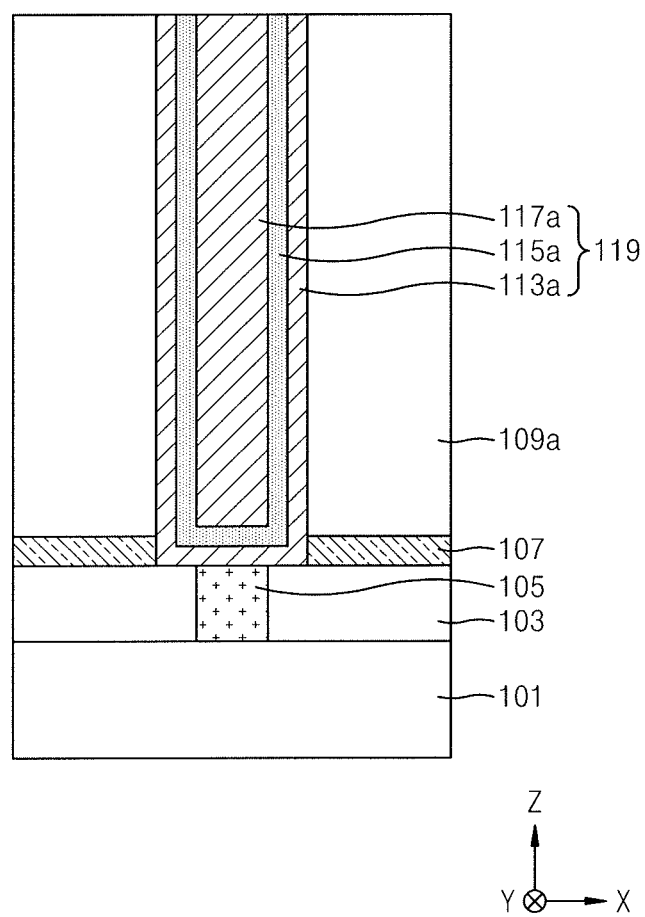

Referring to FIG. 11E, upper portions of the first lower electrode layer 113, the preliminary barrier layer 115, and the second lower electrode layer 117 may be removed to expose an upper surface of the mold layer pattern 109a. The removing process may be performed, for example, by a chemical mechanical polishing process or an etch back process. According to the removing process, the lower electrode structure 119 of FIGS. 1A and 1B may be formed to extend in a direction perpendicular to an upper surface of the substrate 101. The lower electrode structure 119 may include the first lower electrode pattern 113a having a predetermined (e.g., cylindrical) shape, the barrier layer 115a having a predetermined (e.g., cylindrical) shape in a space defined by the first lower electrode pattern 113a, and the second lower electrode pattern 117a having a predetermined (e.g., bar) shape in a space defined by the barrier layer 115a.

Figure 11F:
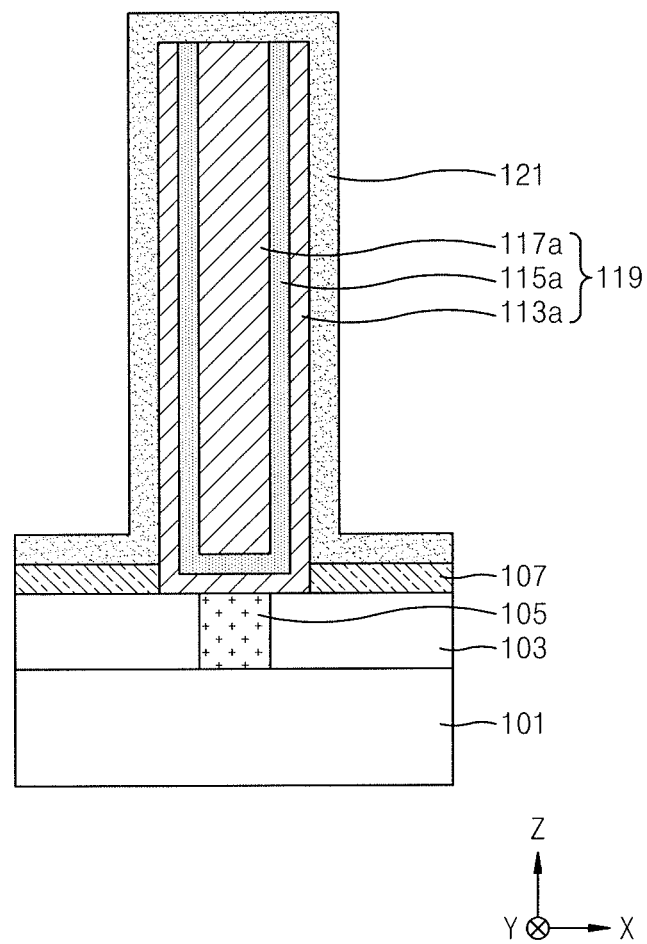

Referring to FIG. 11F, the mold layer pattern 109a may be removed from the substrate 101 and the lower electrode structure 119. The removing process of the mold layer pattern 109a may be performed, for example, by a wet etching process. Side surfaces and an upper surface of the lower electrode structure 119 and an upper surface of the etch stop layer 107 may be exposed by the removing process of the mold layer pattern 109a. Side surfaces and a top surface of the first lower electrode pattern 113a, a top surface of the barrier layer 115a, and a top surface of the second lower electrode pattern 117a may be exposed by the removing process of the mold layer pattern 109a.

After the removing process, the dielectric layer 121 covering the exposed side surfaces and upper surface of the lower electrode structure 119 may be formed. The dielectric layer 121 may include $TiO_2$ or TiON formed, for example, using TiH gas and $O_3$ gas) as a reaction gas. The reaction gas $O_3$ may react with the first lower electrode pattern 113a and oxidize the first lower electrode pattern 113a. However, intrusion of the reaction gas $O_3$ into the second lower electrode pattern 117a may be prevented by the barrier layer 115a. Thus, oxidization of the second lower electrode pattern 117a may be suppressed. The dielectric layer 121 may be formed by ALD, CVD, or PVD.

After the dielectric layer 121 is formed, a heat treatment process may be further performed. The heat treatment process may improve crystallinity of the first lower electrode pattern 113a, that is a lower layer of the dielectric layer 121, and thus may improve crystallinity of the dielectric layer 121 formed on first lower electrode pattern 113a. When crystallinity of the dielectric layer 121 increases, a dielectric constant of the dielectric layer 121 may increase.

Referring to FIGS. 1A and 1B, the upper electrode structure 123 may be formed on the dielectric layer 121 to manufacture the semiconductor device 100. The upper electrode structure 123 may be formed by ALD, CVD, or PVD.

A method for manufacturing the semiconductor device 200 of FIG. 6 may be in accordance with the process described with reference to FIGS. 11A to 11F, except that a silicon concentration gradient is formed in a thickness direction of preliminary barrier layer 115 during a formation process of preliminary barrier layer 115 in FIG. 11D.

Referring to FIG. 6, the barrier layer 215a of FIG. 6 may be formed by adjusting flow of a silicon source according to process progress. For example, the silicon concentration gradient may be formed by increasing flow of $SiH_4$ or $SiH_2Cl_2$, which is a silicon source, during an early period of forming the barrier layer 215a on the first lower electrode pattern 113a and gradually decreasing the flow of the silicon source over time.

The methods for manufacturing the semiconductor devices 300 and 400 in FIGS. 7 to 8B may be in accordance with the process described with reference to FIGS. 11A-11F, except that a multilayer structure is formed during the formation process of the preliminary barrier layer 115 in FIG. 11D.

Referring to FIG. 7, the lower barrier layer 315a1 and the upper barrier layer 315a2 may be respectively formed using different materials as sources. Referring to FIGS. 8A and 8B, the first metal nitride layer 415a1, the first silicon nitride layer 415a2, the second metal nitride layer 415a3, the second silicon nitride layer 415a4, and the third metal nitride layer 415a5 may be stacked in this stated order on the first lower electrode pattern 113a. The thicknesses T3, T4, and T5 of the first to third metal nitride layers 415a1, 415a3, and 415a5 may be different from one another, for example, based on different deposition time periods.

Figure 12:
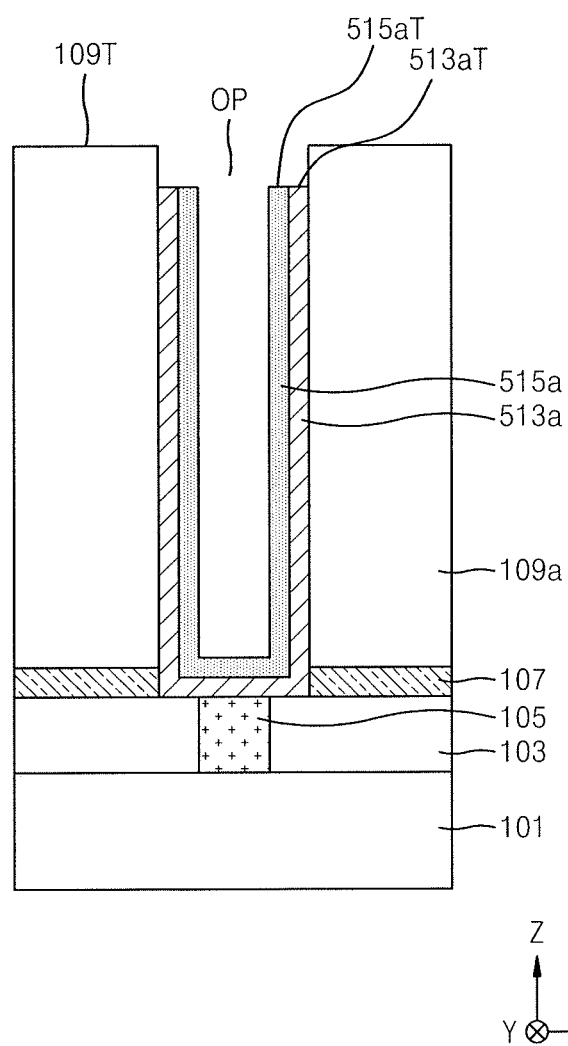
FIG. 12 illustrates various stages in an embodiment of a method for manufacturing the semiconductor device in FIGS. 9A and 9B.

FIG. 12 illustrates various stages of an embodiment of a method for manufacturing the semiconductor device 500 in FIGS. 9A and 9B. The preceding process described with reference to FIGS. 11A to 11C may be applied the same to the method of manufacturing the semiconductor device 500.

Referring to FIG. 12, a preliminary first lower electrode layer and a preliminary barrier layer covering inner side surfaces and the bottom of the opening OP may be formed in the opening OP of the etch stop layer 107 and the mold layer pattern 109a of FIG. 11C.

Afterwards, upper portions of the preliminary first lower electrode layer and the preliminary barrier layer may be removed to expose an upper surface of the mold layer pattern 109a. The removing process may be performed, for example, by a chemical mechanical polishing process or an etch back process. The top surface 513aT of the first lower electrode pattern 513a and the top surface 515aT of the barrier layer 515a may be formed to be lower than a top surface 109T of the mold layer pattern 109a.

Afterwards, referring to FIGS. 9A and 9B, the second lower electrode pattern 517a filling the opening OP defined by the first lower electrode pattern 513a and the barrier layer 515a may be formed. The second lower electrode pattern 517a may be formed to cover the top surface 513aT of the first lower electrode pattern 513a and the top surface 515aT of the barrier layer 515a. Succeeding processes described with reference to FIGS. 11E and 11F may be used to manufacture semiconductor device 500.

FIGS. 13A-13D illustrate various stages of an embodiment of a method for manufacturing the semiconductor device 600 in FIG. 10. The method for manufacturing the semiconductor device 600 is similar to the method described with reference to FIGS. 11A to 11F, except that sacrificial layers 609-1, 609-2, and 609-3 and supporting layers 610-1 and 610-2 are formed above the substrate 101 in order to form the supports 610-1b and 610-2b of FIG. 10.

Figure 13A:
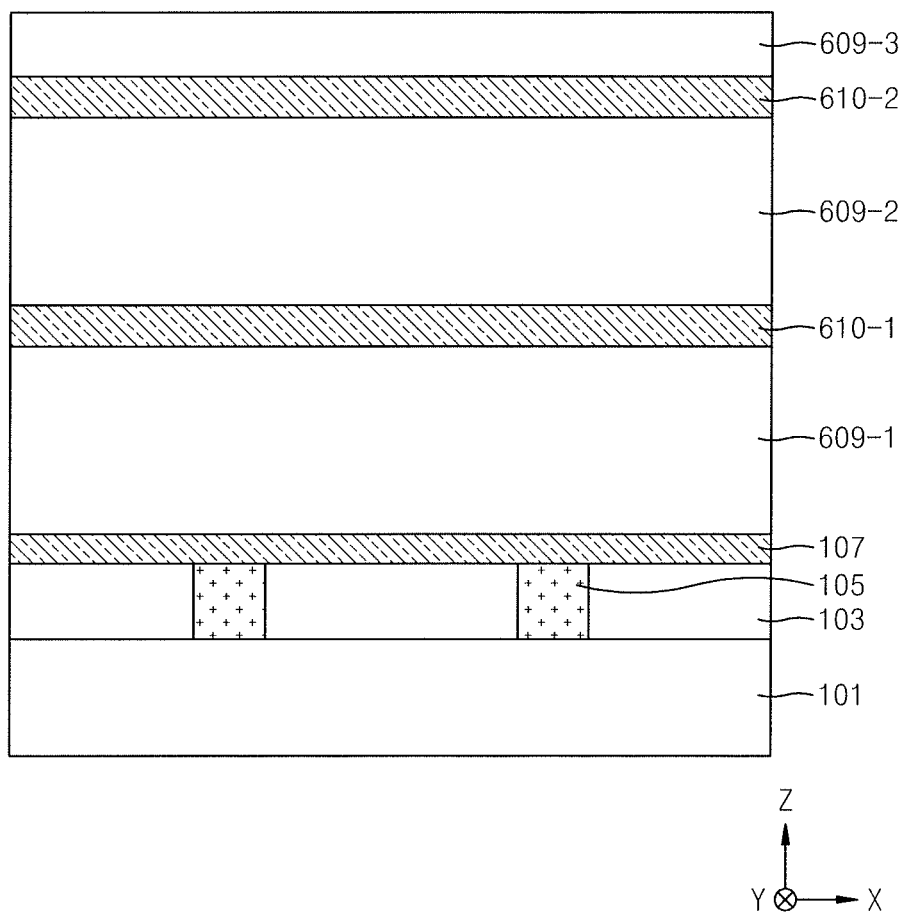
FIGS. 13A-13D illustrate various stages in an embodiment of a method for manufacturing the semiconductor device in FIG. 10.

Referring to FIG. 13A, the sacrificial layers 609-1, 609-2, and 609-3 and the supporting layers 610-1 and 610-2 may be alternately formed on the etch stop layer 107 that is formed on the interlayer insulation layer 103 and the contact plug 105. The sacrificial layers 609-1, 609-2, and 609-3 may include, for example silicon oxide. The sacrificial layers 609-1, 609-2, and 609-3 may include, for example, silicon nitride. In one embodiment, the sacrificial layers 609-1, 609-2, and 609-3 may include silicon nitride. In this case, the sacrificial layers 609-1 and 609-2 may include silicon oxide. The sacrificial layers 609-1, 609-2, and 609-3 may be formed to be thicker than the supporting layers 610-1 and 610-2.

Figure 13B:
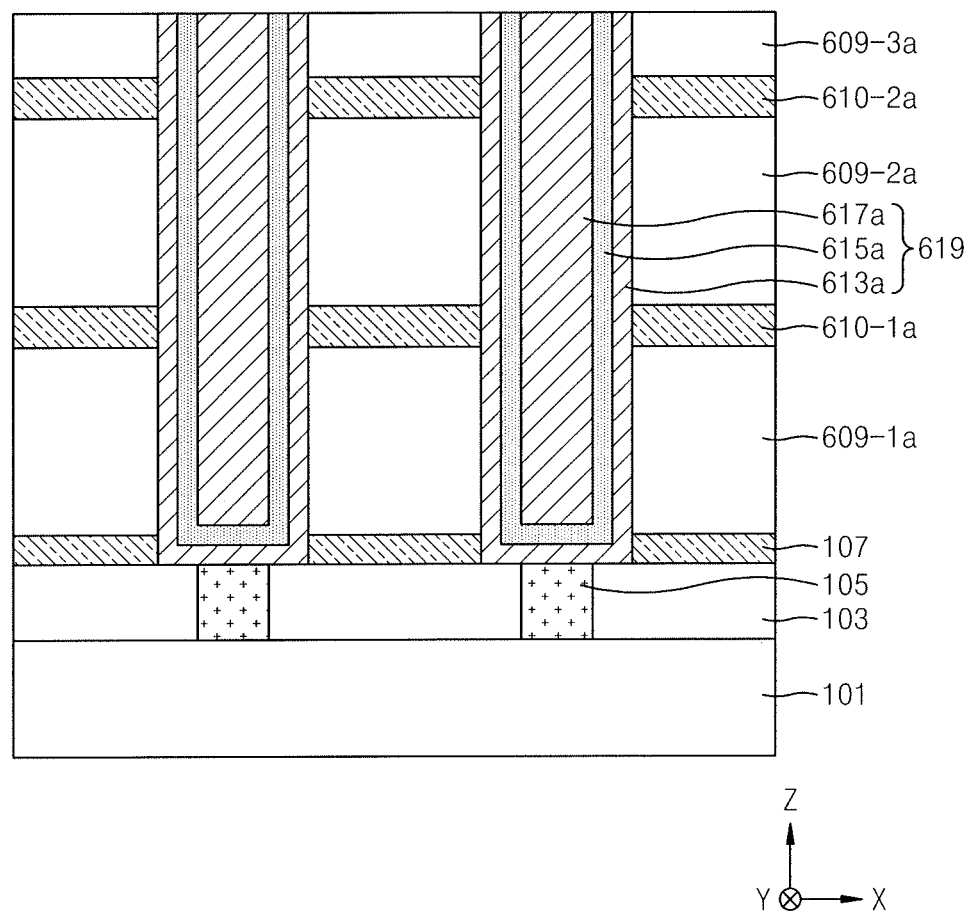

Referring to FIG. 13B, the sacrificial layers 609-1, 609-2, and 609-3, the supporting layers 610-1 and 610-2, and the etch stop layer 107 may be partially etched to form openings exposing an upper surface of the contact plug 105. Thus, the etch stop layer 107, sacrificial patterns 609-1a, 609-2a, and 609-3a, and supporting patterns 610-1a and 610-2a including the openings exposing the upper surface of the contact plug 105 may be formed on the interlayer insulation layer 103 and the contact plug 105.

Afterwards, preliminary first lower electrode layers and preliminary barrier layers covering inner side surfaces and the bottom of the openings may be formed, and preliminary second lower electrode layers filling spaces defined by the preliminary barrier layers may be formed.

Next, upper portions of the preliminary first lower electrode layers, the preliminary barrier layers, and the preliminary second lower electrode layers may be removed to expose an upper surface of the sacrificial pattern 609-3a. According to the removing process, the lower electrode structures 619 extending in a direction perpendicular to an upper surface of the substrate 101 may be formed. The lower electrode structures 619 may each include the first lower electrode pattern 613a, the barrier layer 615a, and the second lower electrode pattern 617a.

Figure 13C:
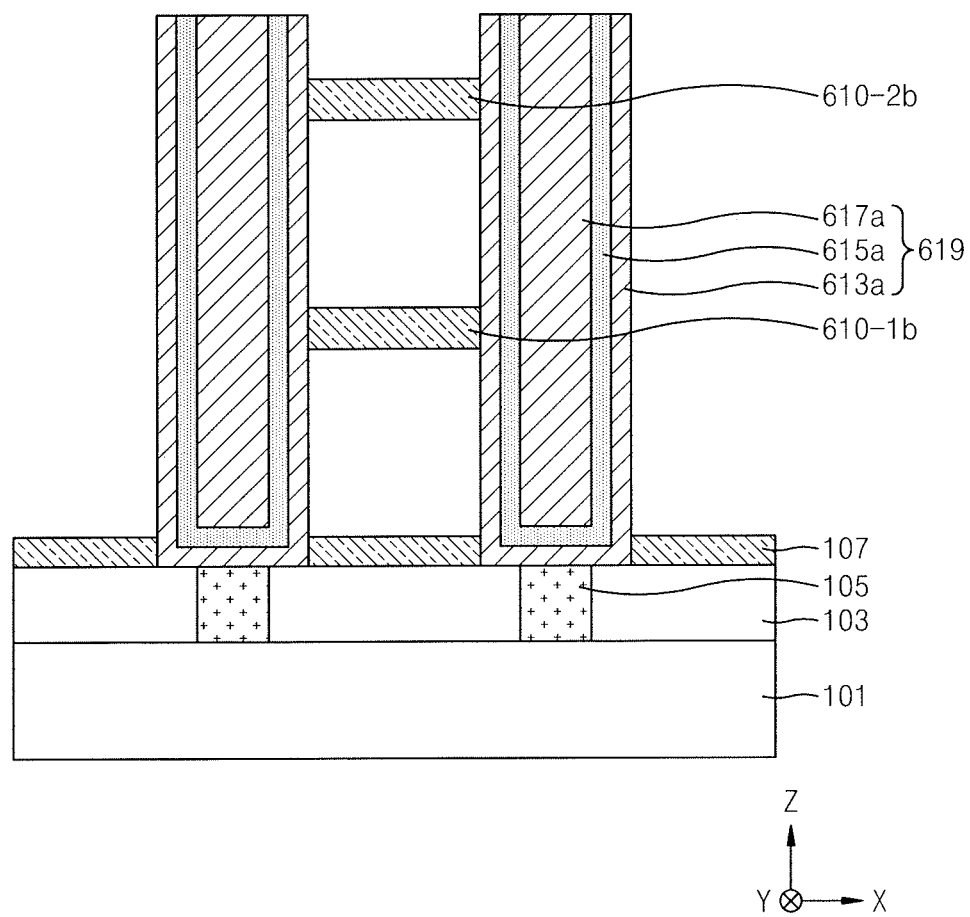

Referring to FIG. 13C, the sacrificial layers 609-1, 609-2, and 609-3 may be removed leaving the lower electrode structures 619 and the supporting patterns 610-1a and 610-2a. In this case, so that only supports 610-1b and 610-2b, from among the supporting patterns 610-1a and 610-2a, that connect at least two adjacent lower electrode structures 619 to each other may remain, the supporting patterns 610-1a and 610-2a excluding the supports 610-1b and 610-2b may be removed using a mask.

Figure 13D:
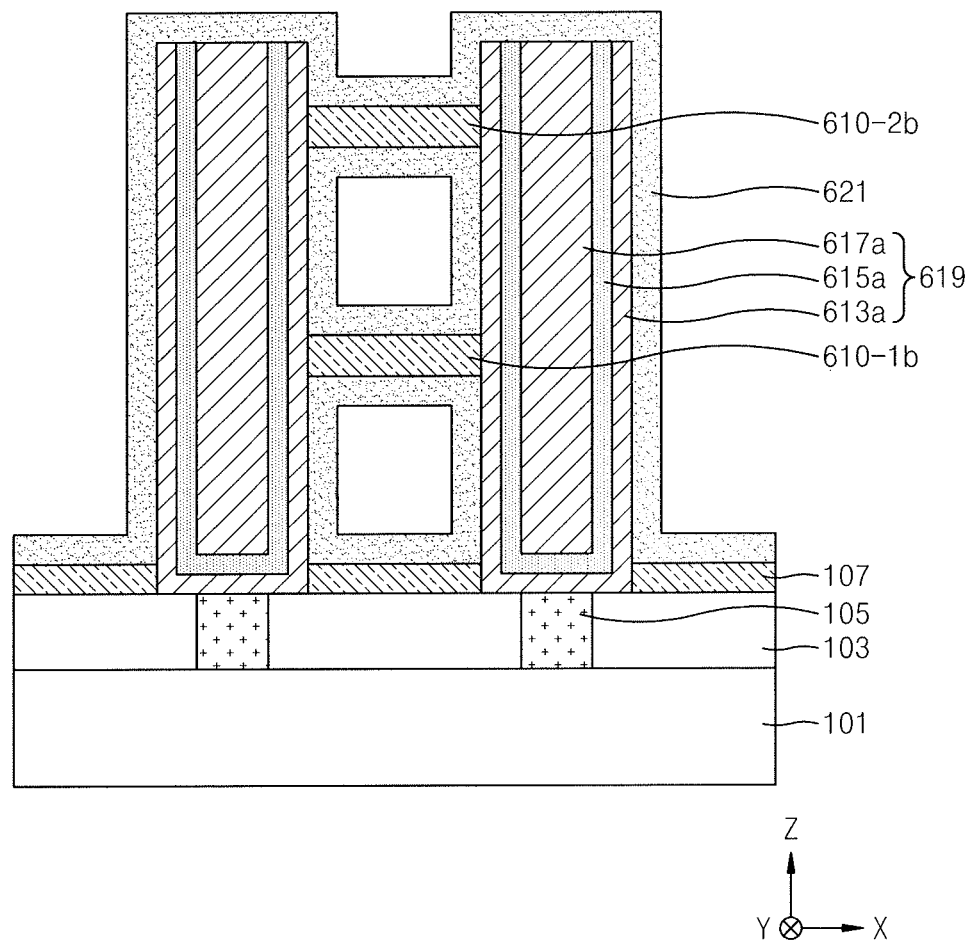

Referring to FIG. 13D, a process may be performed to form the dielectric layer 621 on exterior walls of the lower electrode structures 619 and to connect the supports 610-1b and 610-2b to the lower electrode structures 619. The dielectric layer 621 may be formed along side surfaces and upper surfaces of the lower electrode structures 619 and the supports 610-1b and 610-2b.

Afterwards, referring to FIG. 10, upper electrode structure 623 may be formed on the dielectric layer 621 of FIG. 13D to manufacture semiconductor device 600.

Figure 14:
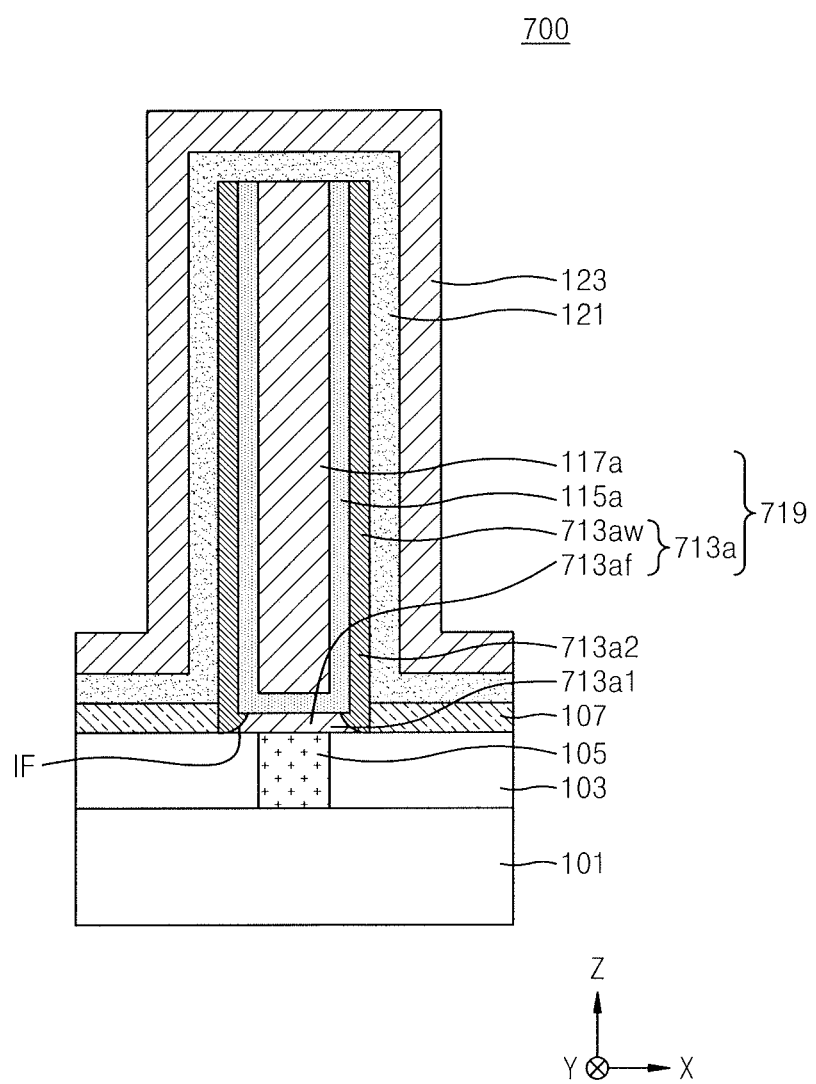
FIGS. 14 and 15 illustrate other embodiments of a semiconductor device.
Figure 15:
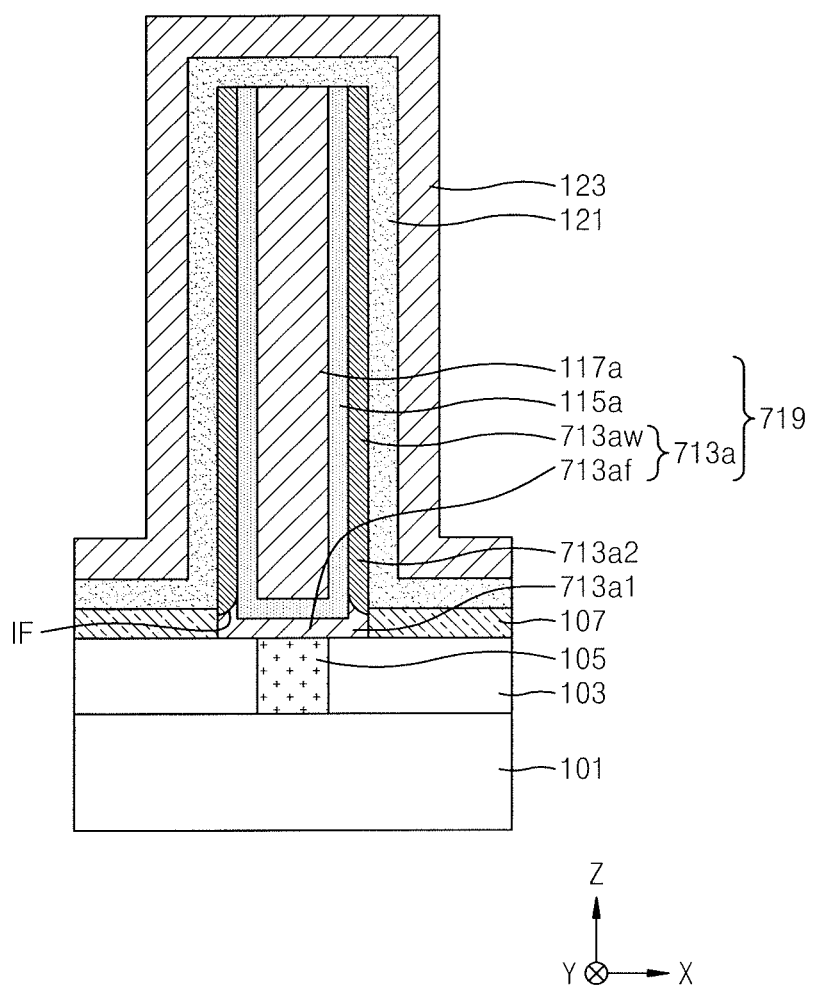

FIGS. 14 and 15 are cross-sectional views of another embodiments of semiconductor devices 700 and 700A. The semiconductor devices 700 and 700A are similar to the semiconductor device 100 in FIGS. 1A and 1B, except for configurations of a first lower electrode pattern 713a.

Referring to FIG. 14, the semiconductor device 700 may include the substrate 101, a lower electrode structure 719 above the substrate 101, the dielectric layer 121 on side surfaces and an upper surface of the lower electrode structure 719, and the upper electrode structure 123 on the dielectric layer 121. The lower electrode structure 719 may include the first lower electrode pattern 713a having a predetermined (e.g., cylinder) shape, the barrier layer 115a on the first lower electrode pattern 713a, and the second lower electrode pattern 117a in a space defined by the barrier layer 115a.

The first lower electrode pattern 713a may include a side wall 713aw and a floor portion 713af. The floor portion 713af may be flat and may contact the contact plug 105 or be electrically connected to the contact plug 105. The side wall 713aw may vertically extend along the edge of the floor portion 713af and may define an inner space in which the barrier layer 115a and the second lower electrode pattern 117a are provided. In some embodiments, the side wall 713aw may have a cylinder shape.

The first lower electrode pattern 713a may include a first portion 713a1 and a second portion 713a2. The first portion 713a1 may include a first metal element. The first metal element may include titanium (Ti), tungsten (W), tantalum (Ta), hafnium (Hf), aluminum (Al), zirconium (Zr), or an alloy thereof. Specifically, the first portion 713a1 may include at least one of Ti. TiN W, WN, Ta, TaN, HfN, ZrN, TiAlN, TaSiN, TiSiN, and TaAlN. The second portion 713a2 may include an oxide of the first portion 713a1. For example, the second portion 713a2 may include at least one of $TiO_2$, TiON, $WO_3$, WON, TaO, TaON, $HfO_2$, HfON, $ZrO_2$, ZrON, TiAlON, TaSiON, TiSiON, and TaAlON.

In some embodiments, the first portion 713a1 may include titanium nitride (TiN). In some embodiments, the second portion 713a2 may include titanium oxynitride (TiON) and/or titanium oxide ($TiO_2$). In some embodiments, the second portion 713a2 may consist of titanium oxynitride (TiON) and/or titanium oxide ($TiO_2$).

In general, an electric resistance of titanium nitride (TiN), which is an electric conductor, is significantly low compared to titanium oxynitride (TiON) or titanium oxide ($TiO_2$), which is an electric insulator. An electric resistance of the second portion 713a2 is higher than that of the first portion 713a1. In some embodiments, an electric resistance of the second portion 713a2 may be 10 times or greater, 100 times or greater, or 500 times or greater compared to that of the first portion 713a1.

The first portion 713a1 may be mainly located over the floor portion 713af. The second portion 713a2 may be mainly located over the side wall 713aw.

A distinction may be made between the first portion 713a1 and the second portion 713a2 by an interface IF. The interface IF may be defined based on a concentration of an oxide. For example, a location where, while a concentration of the above-described oxide (e.g., $TiO_2$, TiON, $WO_3$, WON, TaO, TaON, $HfO_2$, HfON, $ZrO_2$, ZrON, TiAlON, TaSiON, TiSiON, TaAlON) changes according to a location from the floor portion 713af to a top of the side wall 713aw, the concentration of the oxide substantially discontinuously increases may be defined as the interface IF.

In some embodiments, the interface IF between the first portion 713a1 and the second portion 713a2 may be located at the floor portion 713af.

Referring to FIG. 15, the interface IF between the first portion 713a1 and the second portion 713a2 may be located at the side wall 713aw.

In some embodiments, the concentration of the oxide may gradually change. In other words, the concentration of the oxide may gradually increase or decrease without a leaping point on the analysis material. In this case, it may be difficult to define the interface IF in view of the above-described definition of the interface IF.

Figure 16:
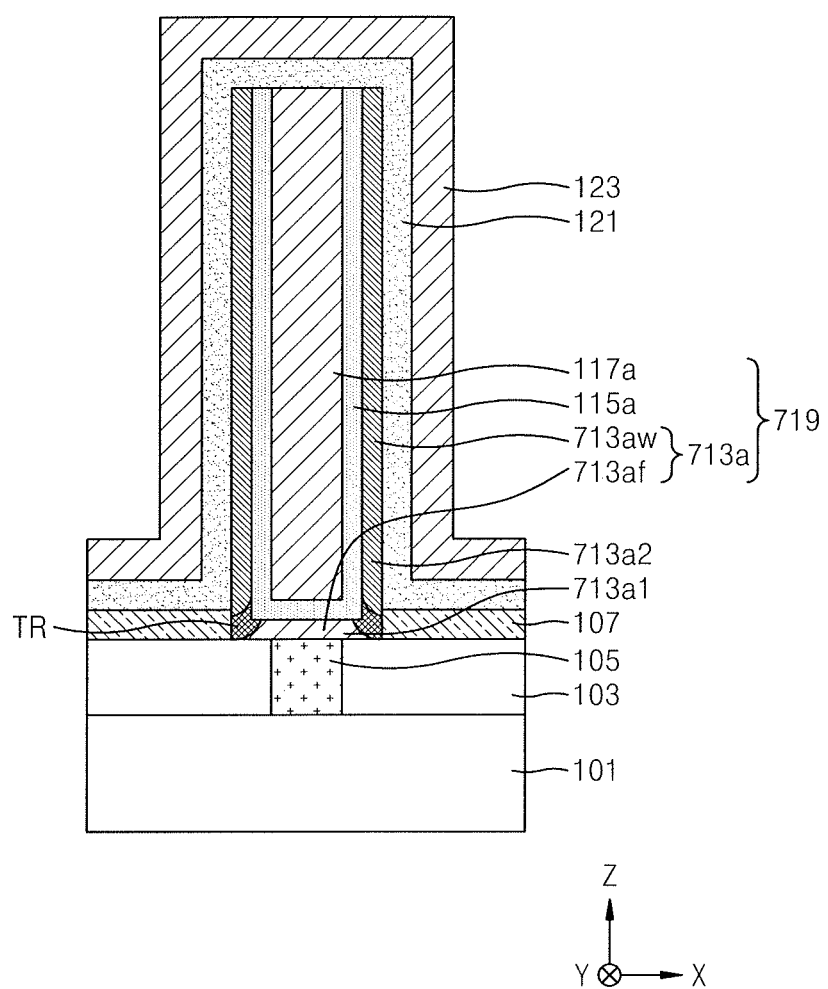
FIG. 16 illustrates a cross-sectional view of an embodiment of a semiconductor device having a transition section between the first portion and the second portion.

In this case, a distinction may be made between the first portion 713a1 and the second portion 713a2 by a transition section TR. FIG. 16 illustrates a cross-sectional view of an embodiment of a semiconductor device 700B having the transition section TR between the first portion 713a1 and the second portion 713a2.

Referring to FIG. 16, the transition section TR may be between the first portion 713a1 located over the floor portion 713af and the second portion 713a2 located over the side wall 713aw. The transition section TR may be defined as a region where the concentration of the oxide is 30% to 70% of a maximum concentration in the first lower electrode pattern 713a.

Figure 17:
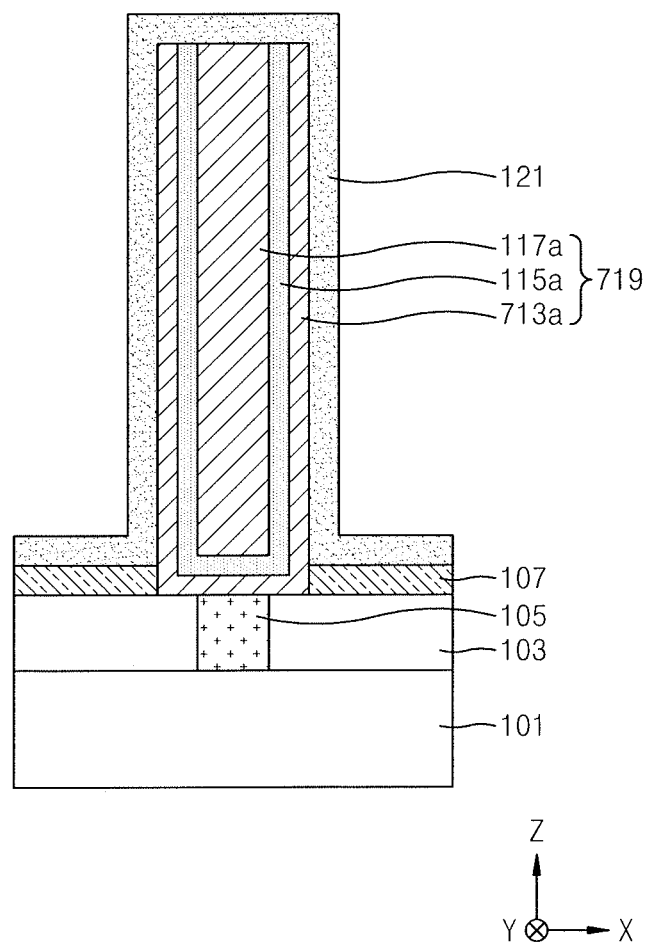
FIG. 17 illustrates various stages in an embodiment of a method for manufacturing the semiconductor devices in FIGS. 14 to 16.

FIG. 17 illustrates various stages in an embodiment of a method for manufacturing the semiconductor devices 700, 700A, and 700B in FIGS. 14 to 16. The method may be performed in the same manner until the operations illustrated in FIGS. 11A-11E, and the operation of FIG. 17 may succeed that of FIG. 11E.

Referring to FIG. 17, a mold layer pattern 109a may be removed from the substrate 101 and the lower electrode structure 719. The removing process of the mold layer pattern 109a may be performed through a wet etching process. The side surfaces and the upper surface of the lower electrode structure 719 and an upper surface of an etch stop pattern 107a may be exposed by the removing process of the mold layer pattern 109a. Specifically, side surfaces and a top surface of the first lower electrode pattern 713a, a top surface of the barrier layer 115a, and a top surface of the second lower electrode pattern 117a may be exposed by the removing process of the mold layer pattern 109a.

After the removing process, the dielectric layer 121 covering the exposed side surfaces and upper surface of the lower electrode structure 719 may be formed. The dielectric layer 121 may include $TiO_2$ or TiON formed, for example, by using TiH gas and $O_3$ gas) as a reaction gas. As described above, the reaction $O_3$ may react with the first lower electrode pattern 713a and partially oxidize the first lower electrode pattern 713a. In this regard, an oxidized portion of the first lower electrode pattern 713a corresponds to the second portion 713a2 described above with reference to FIGS. 14 to 16, and an unoxidized portion of the first lower electrode pattern 713a corresponds to the first portion 713a1 described above with reference to FIGS. 14 to 16.

The way the second portion 713a2 is formed may change according to process conditions under which the dielectric layer 121 is formed. Although it is not intended to limit one or more embodiments described herein to a particular theory, the way an interface between the first portion 713a1 and the second portion 713a2 is formed may change according to temperature, composition of an oxidizing agent, whether partial oxidization reaction of the first lower electrode pattern 713a is diffusion-controlled or reaction-controlled, etc.

Intrusion of the reaction O$_3$ into the second lower electrode pattern 117a may be prevented by the barrier layer 115a. Thus, oxidization of the second lower electrode pattern 117a may be suppressed. The dielectric layer 121 may be formed by ALD, CVD, or PVD.

After the dielectric layer 121 is formed, a heat treatment process may be further performed. The heat treatment process may improve crystallinity of the first lower electrode pattern 713a, which is underlying the dielectric layer 121, and thus may improve crystallinity of the dielectric layer 121 on the first lower electrode pattern 113a. When crystallinity of the dielectric layer 121 increases, a dielectric constant of the dielectric layer 121 may increase.

Referring to FIGS. 14 to 16 again, the semiconductor devices 700, 700A, and 700B may be manufactured by forming the upper electrode structure 123 on the dielectric layer 121. The upper electrode structure 123 may be formed by ALD, CVD, or PVD.

Figure 18:
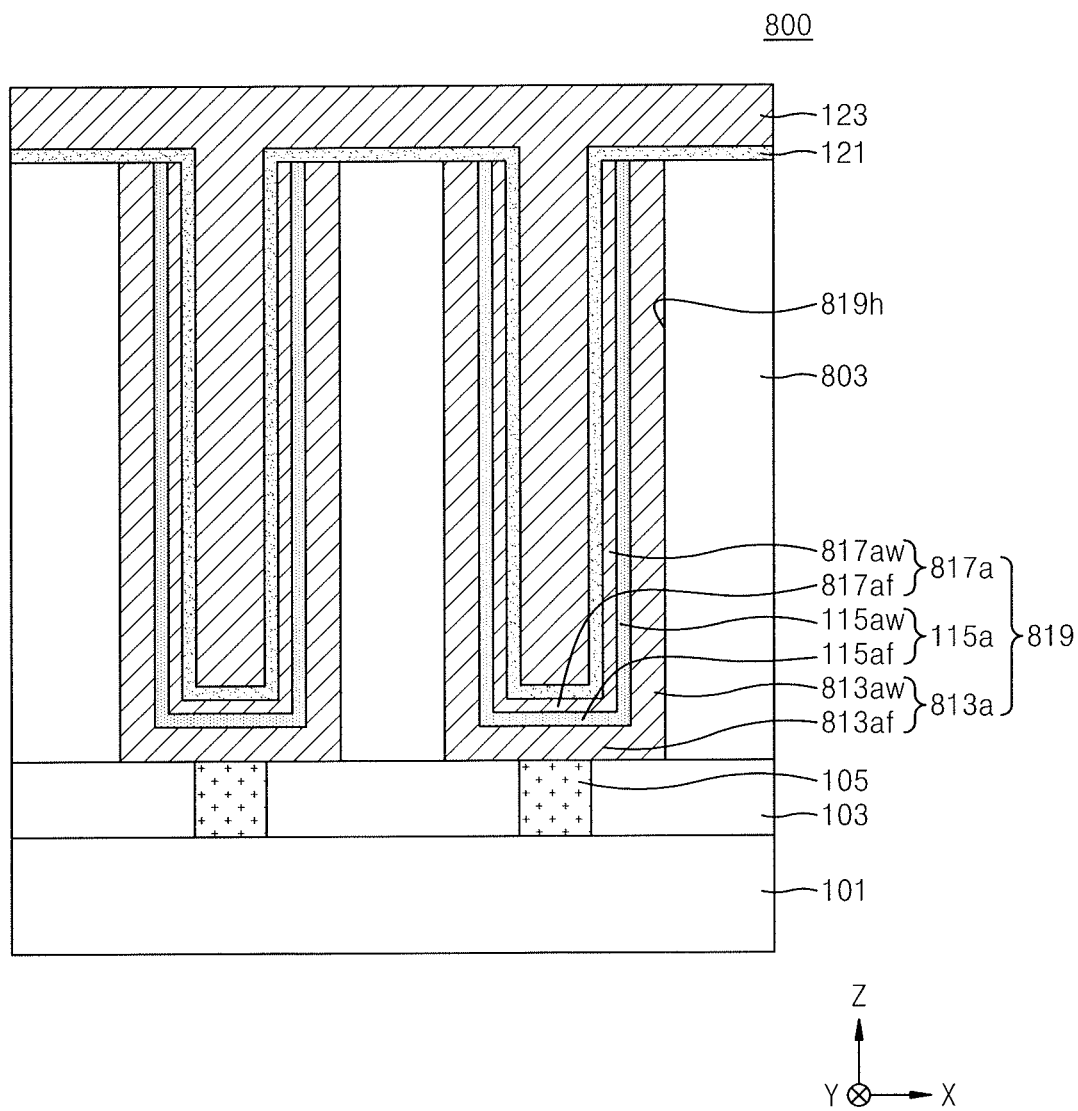
FIG. 18 illustrates another embodiment of a semiconductor device.

FIG. 18 illustrates a cross-sectional view of still another embodiment of a semiconductor device 800.

Referring to FIG. 18, the semiconductor device 800 may include the substrate 101, a lower electrode structure 819 above the substrate 101 and extending in a direction (direction Z) perpendicular to an upper surface of the substrate 101, the dielectric layer 121 on inner side surfaces and an upper surface of the lower electrode structure 819, and the upper electrode structure 123 on the dielectric layer 121. The substrate 101, the dielectric layer 121, and the upper electrode structure 123 have been described in detail with reference to FIG. 1A, etc., and accordingly, concrete descriptions thereof are omitted.

The lower electrode structure 819 may have a cylinder shape having a floor portion and may be disposed in a lower electrode hole 819h. The lower electrode structure 819 may have an inner surface, and the dielectric layer 121 may line the inner side surface of the lower electrode structure 819 and an upper surface of the floor portion. Also, the upper electrode structure 123 may protrude downwards and be inserted into a space defined by the dielectric layer 121. The dielectric layer 121 may horizontally extend along the upper surface of the lower electrode structure 819.

The lower electrode structure 819 includes a first lower electrode pattern 813a, the barrier layer 115a, and a second lower electrode pattern 817a. The first lower electrode pattern 813a includes a side wall 813aw and a floor portion 813af. The first lower electrode pattern 813a may have a cylinder shape as the first lower electrode pattern 713a does. The barrier layer 115a may line an inner surface of the side wall 813aw of the first lower electrode pattern 813a and an upper surface of the floor portion 813af. In some embodiments, the barrier layer 115a may extend, in a substantially uniform thickness, along an inner surface of the side wall 813aw and an upper surface of the floor portion 813af. Accordingly, as the first lower electrode pattern 813a does, the barrier layer 115a may also have a cylinder shape having a side wall 115aw and a floor portion 115af.

The second lower electrode pattern 817a may line an inner surface of the side wall 115aw of the barrier layer 115a and an upper surface of the floor portion 115al The second lower electrode pattern 817a may extend along the inner surface of the side wall 115aw and the upper surface of the floor portion 115af. In some embodiments, a thickness of the second lower electrode pattern 817a may be uniform. In some embodiments, a thickness of the second lower electrode pattern 817a may change according to location. Similar to the barrier layer 115a, the second lower electrode pattern 817a may also have a cylinder shape having a side wall and a floor portion.

The dielectric layer 121 may cover an inner surface and an upper surface of the second lower electrode pattern 817a, and further, may extend to cover an upper surface of the barrier layer 115a and an upper surface of the first lower electrode pattern 813a. In some embodiments, the dielectric layer 121 may be connected to a dielectric layer of a neighboring semiconductor device at substantially the same level as an upper surface of the first lower electrode pattern 813a. The dielectric layer 121 may vertically extend along the inner surface of the second lower electrode pattern 817a but does not vertically extend along an outer side wall of the first lower electrode pattern 813a.

An interlayer insulation layer 803 may be disposed between two neighboring semiconductor devices 800. Specifically, the lower electrode hole 819h may be formed in the interlayer insulation layer 803, and the semiconductor device 800 may be provided in the lower electrode hole 819h. In some embodiments, an outer side wall of the first lower electrode pattern 813a of the semiconductor device 800 may be covered by the interlayer insulation layer 803. In some embodiments, an outer side wall of the first lower electrode pattern 813a does not directly contact the interlayer insulation layer 803 but may be surrounded by the interlayer insulation layer 803. In this regard, without an electric conductor, there may be only an electric insulator between the outer side wall of the first lower electrode pattern 813a and the interlayer insulation layer 803.

The first lower electrode pattern 813a may include a first portion including a first metal element. The first metal element may include titanium (Ti), tungsten (W), tantalum (Ta), hafnium (Hf), aluminum (Al), zirconium (Zr), or an alloy thereof. Specifically, the first portion may include at least one of Ti, TiN, W, WN, Ta, TaN, HfN, ZrN, TiAlN, TaSiN, TiSiN, and TaAlN. In some embodiments, the first lower electrode pattern 813a may not include an oxide of metal or an oxide of metal nitride.

The second lower electrode pattern 817a may include an oxide of the first portion. For example, the oxide of the first portion may include at least one of TiO$_2$, TiON, WO$_3$, WON, TaO, TaON, HfO$_2$, HfON, ZrO$_2$, ZrON, TiAlON, TaSiON, TiSiON, and TaAlON. In some embodiments, the second lower electrode pattern 817a may entirely consist of the oxide of the first portion.

Figure 19:
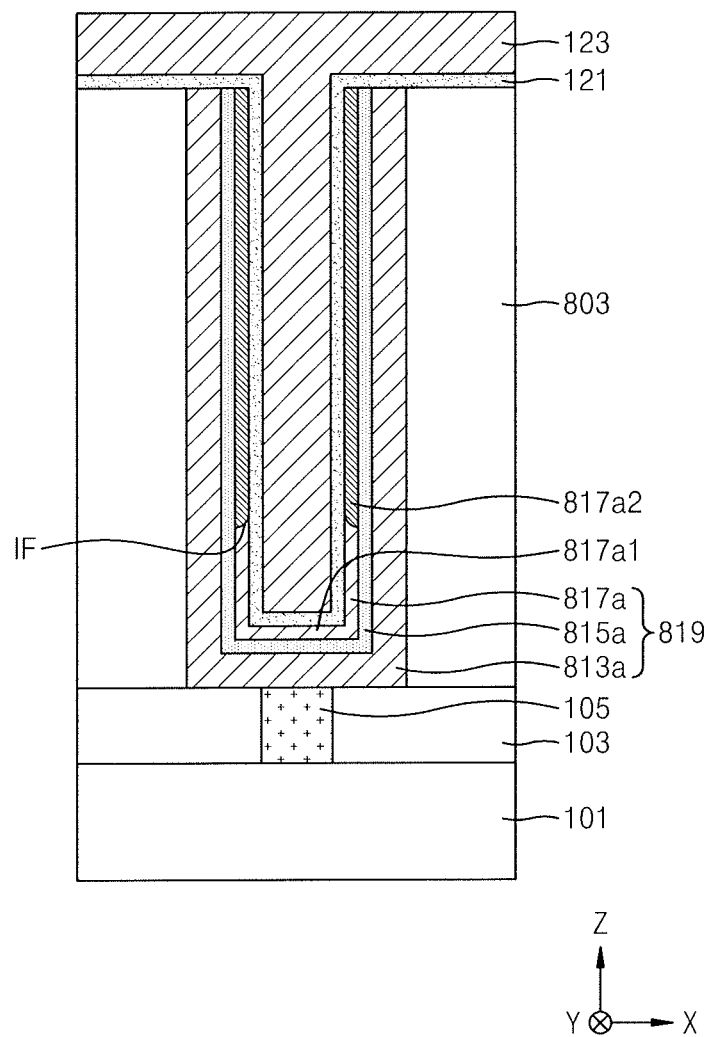
FIGS. 19 to 21 schematically illustrate examples of the second lower electrode pattern including a first portion and a second portion.
Figure 20:
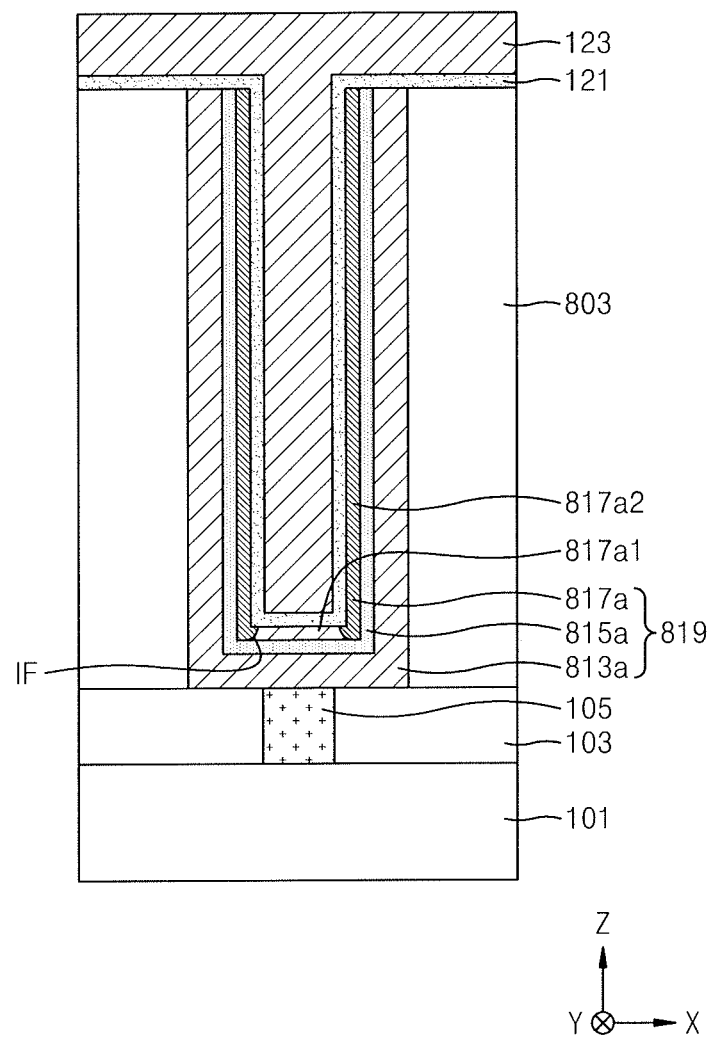
Figure 21:
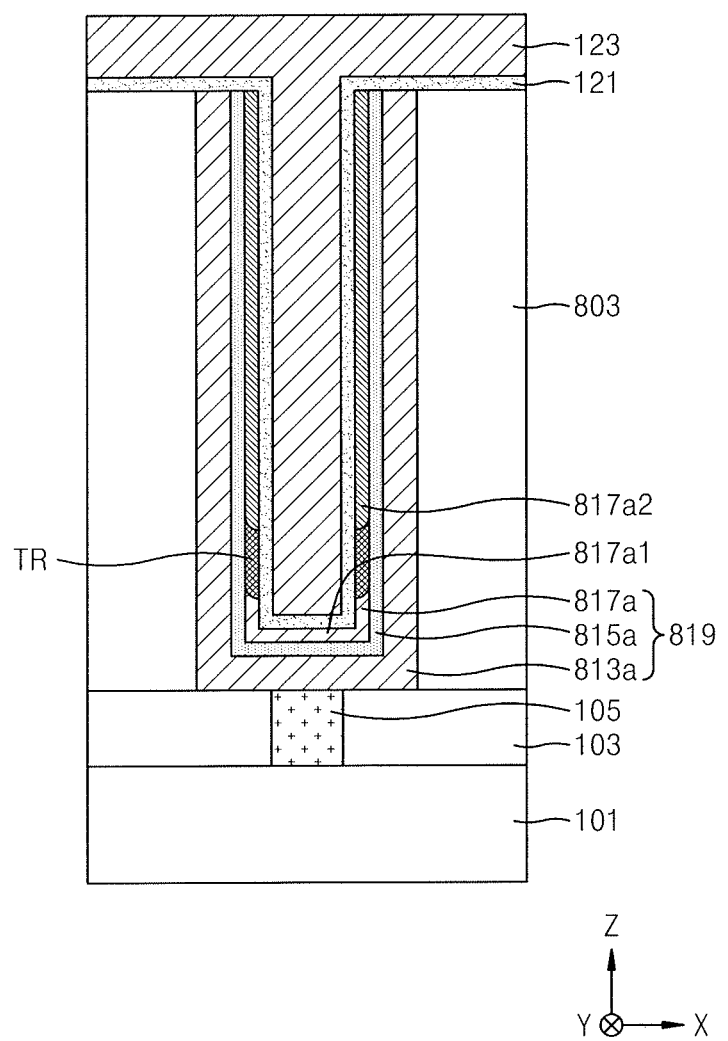

In some embodiments, the second lower electrode pattern 817a may include a first portion including a first metal element, and a second portion, which is an oxide of the first portion. FIGS. 19 to 21 schematically illustrate examples of the second lower electrode pattern 817a including a first portion 817a1 and a second portion 817a2.

Referring to FIG. 19, the second lower electrode pattern 817a includes the first portion 817a1 and the second portion 817a2. The second portion 817a2 may be located over the side wall 817aw. The first portion 817a1 neighboring the second portion 817a2 with the interface IF therebetween may be located over the floor portion 817af and the side wall 817aw adjacent thereto.

Referring to FIG. 20, the interface IF may be located at the floor portion 817af. The first portion 817a1 may be limited to the floor portion 817af. Also, the entire side wall 817aw may be included in the second portion 817a2. A portion of the second portion 817a2 may extend to the floor portion 817af.

Referring to FIG. 21, as illustrated in FIG. 16, the transition section TR may be between the first portion 817a1 and the second portion 817a2.

FIGS. 22A-22G illustrate various stages in an embodiment of a method for manufacturing the semiconductor device 800 in FIGS. 18 to 21.

Figure 22A:
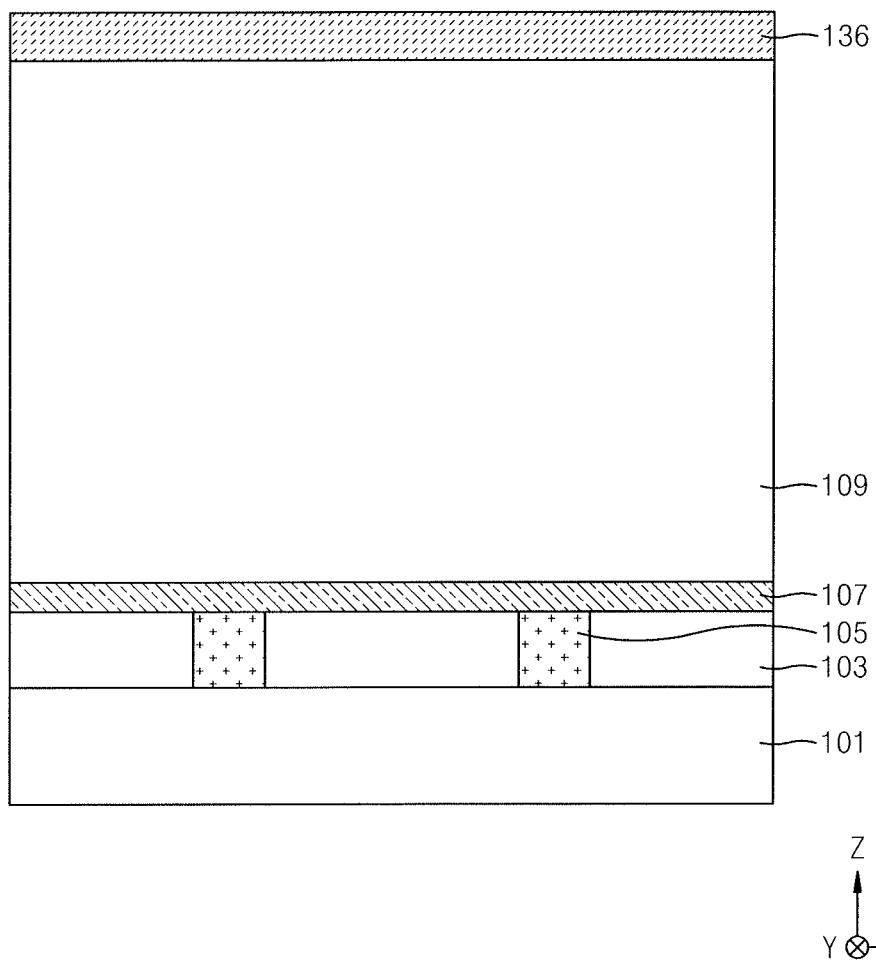
FIGS. 22A-22G illustrate various stages in an embodiment of a method for manufacturing the semiconductor device in FIGS. 18 to 21.

Referring to FIG. 22A, a preliminary interlayer insulation layer may be formed on the substrate 101. The interlayer insulation layer 103, including a contact hole exposing a surface of the substrate 101, may be formed by etching a partial region of the preliminary interlayer insulation layer. The surface of the substrate 101 that is exposed to the bottom of the contact hole may be a surface of a transistor or a conductive line in the substrate 101. The contact plug 105 may be formed by filling the contact hole with a conductive material and performing polishing to expose an upper surface of the interlayer insulation layer 103. The etch stop layer 107 may be formed on the interlayer insulation layer 103 and the contact plug 105, the etch stop layer 107 including an insulating material.

The mold layer 109 and a anti-reflection layer 136 may be formed on the etch stop layer 107. The mold layer 109 may be a layer for forming the lower electrode hole 819h in which the lower electrode structure 819 is provided as shown in FIGS. 18 to 21. Accordingly, the thickness of the mold layer 109 may be formed to be the same as or higher than a height of the lower electrode structure 819. The mold layer 109 may include a material having high etch selectivity with respect to the etch stop layer 107. The mold layer 109 may include, for example, silicon oxide and may include BPSG, TOSZ, HDP, PE-TEOS, etc. The anti-reflection layer 136 may include, for example, silicon oxynitride (SiON).

Figure 22B:
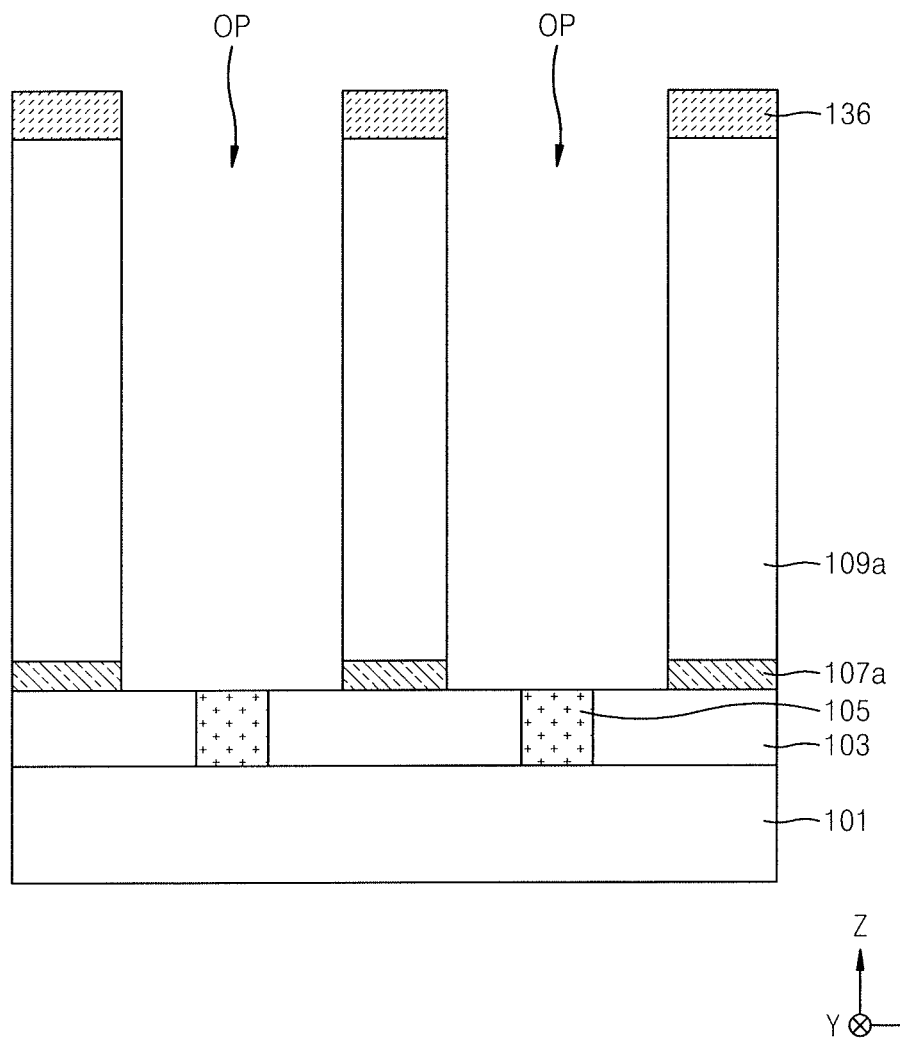

Referring to FIG. 22B, the mold layer 109 and the etch stop layer 107 of FIG. 22A may be partially etched to form the opening OP exposing an upper surface of the contact plug 105. Thus, the etch stop layer pattern 107a and the mold layer pattern 109a exposing the upper surface of the contact plug 105 may be formed on the interlayer insulation layer 103 and the contact plug 105.

Figure 22C:
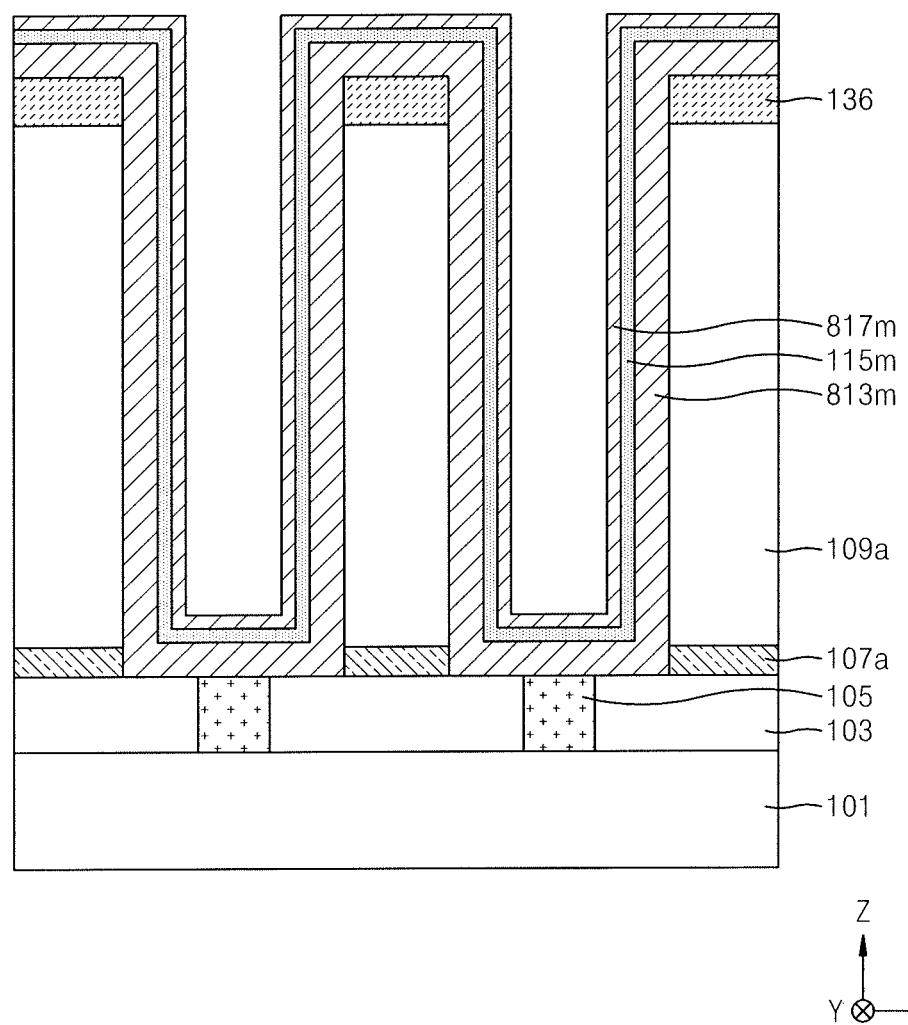

Referring to FIG. 22C, a first lower electrode material layer 813m, a barrier material layer 115m, and a second lower electrode material layer 817m are sequentially formed to cover inner side surfaces and the bottom of the opening OP of FIG. 22B. Each of the first lower electrode material layer 813m, the barrier material layer 115m, and the second lower electrode material layer 817m may be formed, for example, by ALD, CVD, or PVD, but is not particularly limited thereto.

The barrier material layer 115m may be metal silicon nitride, for example, TiSiN, TaSiN, WSiN. ZrSiN, AlSiN, etc. In some embodiments, when the barrier material layer 115m is TiSiN, the barrier material layer 115m may be formed by using $SiH_4$ or $SiH_2Cl_2$, which is a silicon source, $TiCl_4$, which is a titanium source, and $N_2$ or $NH_3$ gas, which is a nitrogen source.

Figure 22D:
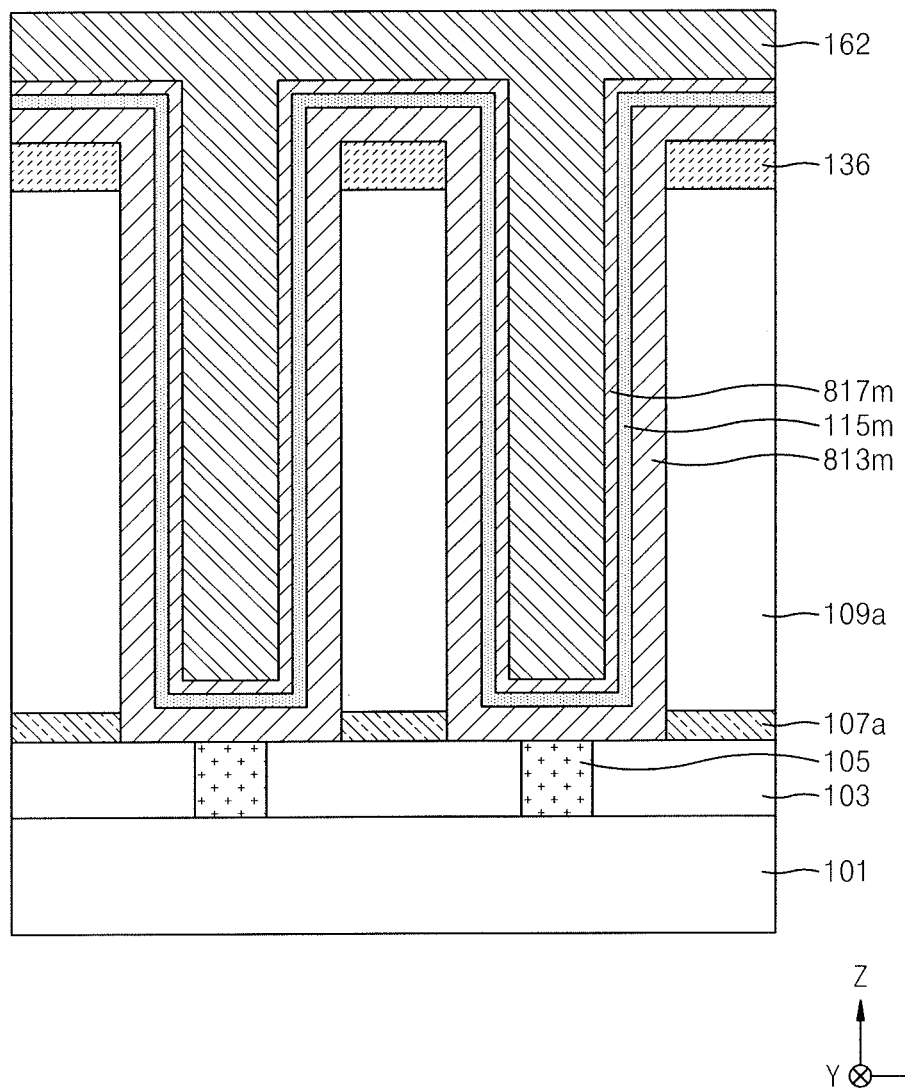

Referring to FIG. 22D, a sacrificial layer 162 is formed over an inner space defined by the second lower electrode material layer 817m and an upper surface of the second lower electrode material layer 817m. The sacrificial layer 162 may include a photoresist layer or a silicon oxide layer.

Figure 22E:
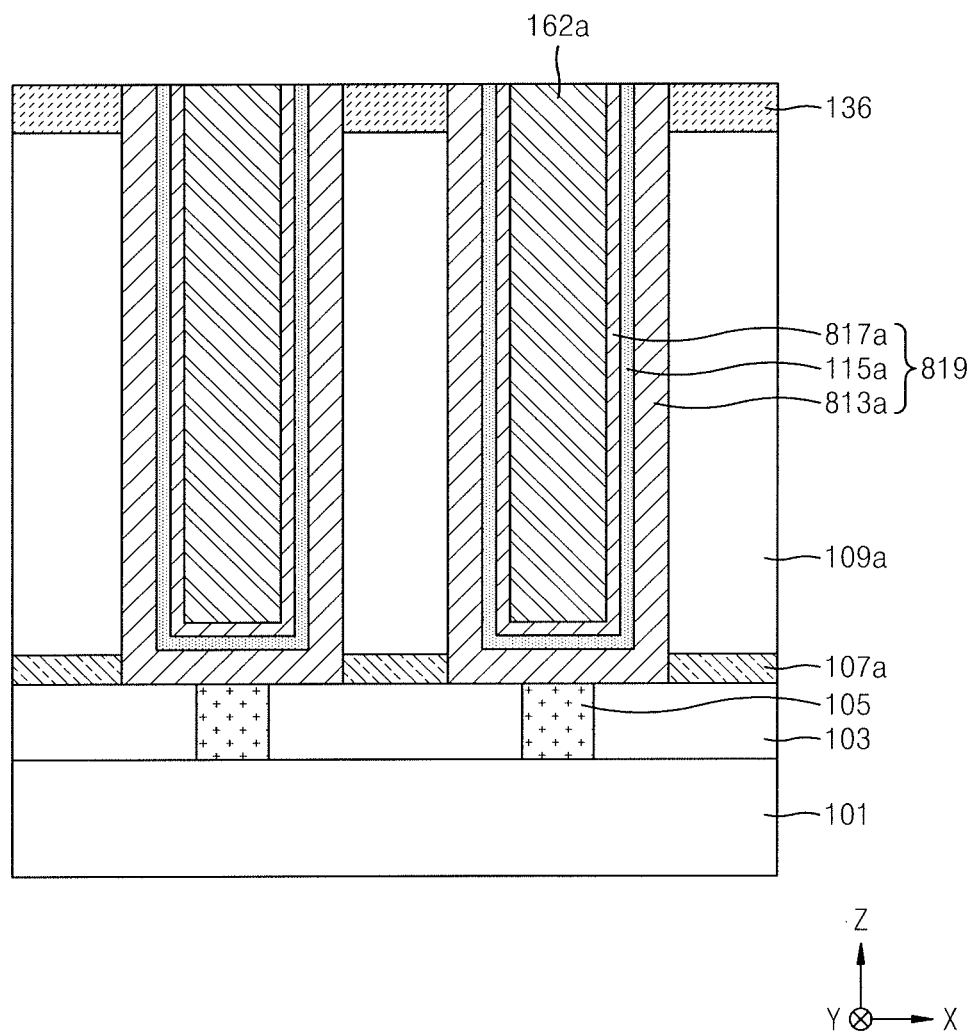

Referring to FIG. 22E, the sacrificial layer 162, the first lower electrode material layer 813m, the barrier material layer 115m, and the second lower electrode material layer 817m may be partially removed until an upper surface of the anti-reflection layer 136 is exposed. Removal of the sacrificial layer 162, the first lower electrode material layer 813m, the barrier material layer 115m, and the second lower electrode material layer 817m may be performed by etch-back or chemical mechanical polishing (CMP). Also, the lower electrode structure 819 including the first lower electrode pattern 813a, the barrier layer 115a, and the second lower electrode pattern 817a is formed by the removal.

Figure 22F:
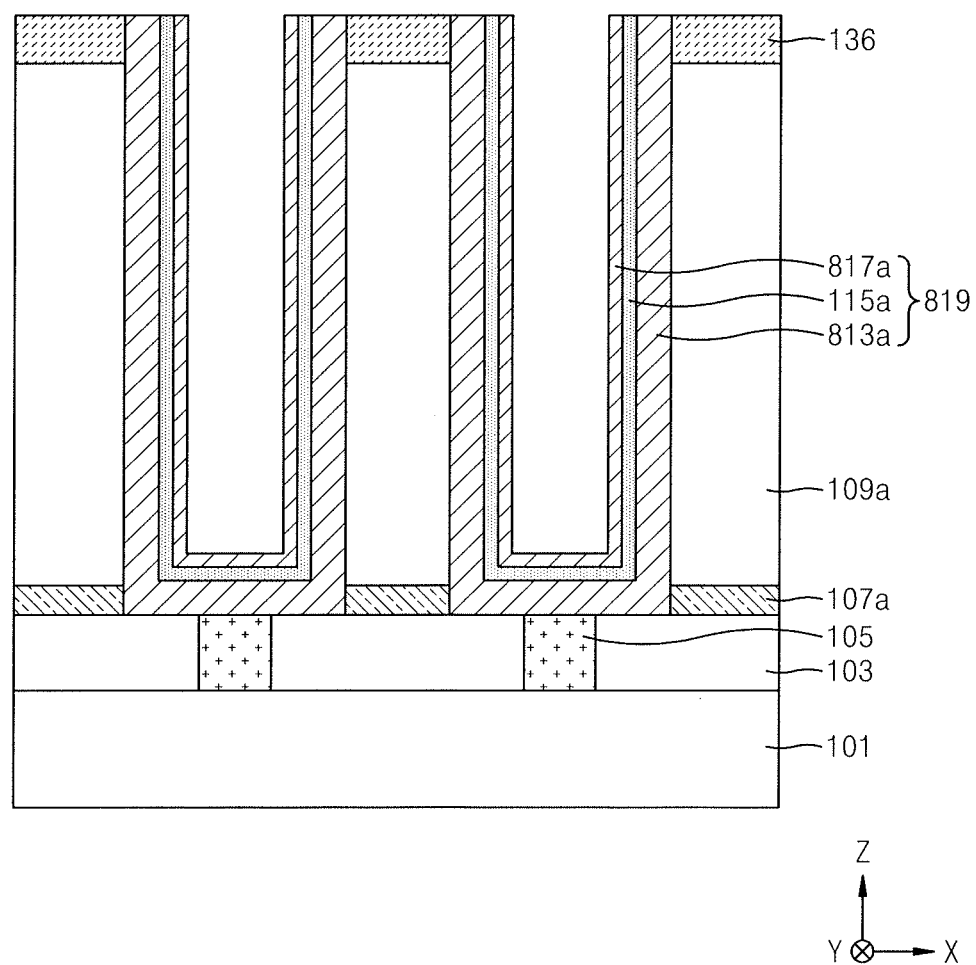

Referring to FIG. 22F, a sacrificial layer 162a may be removed by wet etching or ashing. When the sacrificial layer 162a includes photoresist, ashing may be effective, and when the sacrificial layer 162a includes silicon oxide, wet etching may be effective.

Figure 22G:
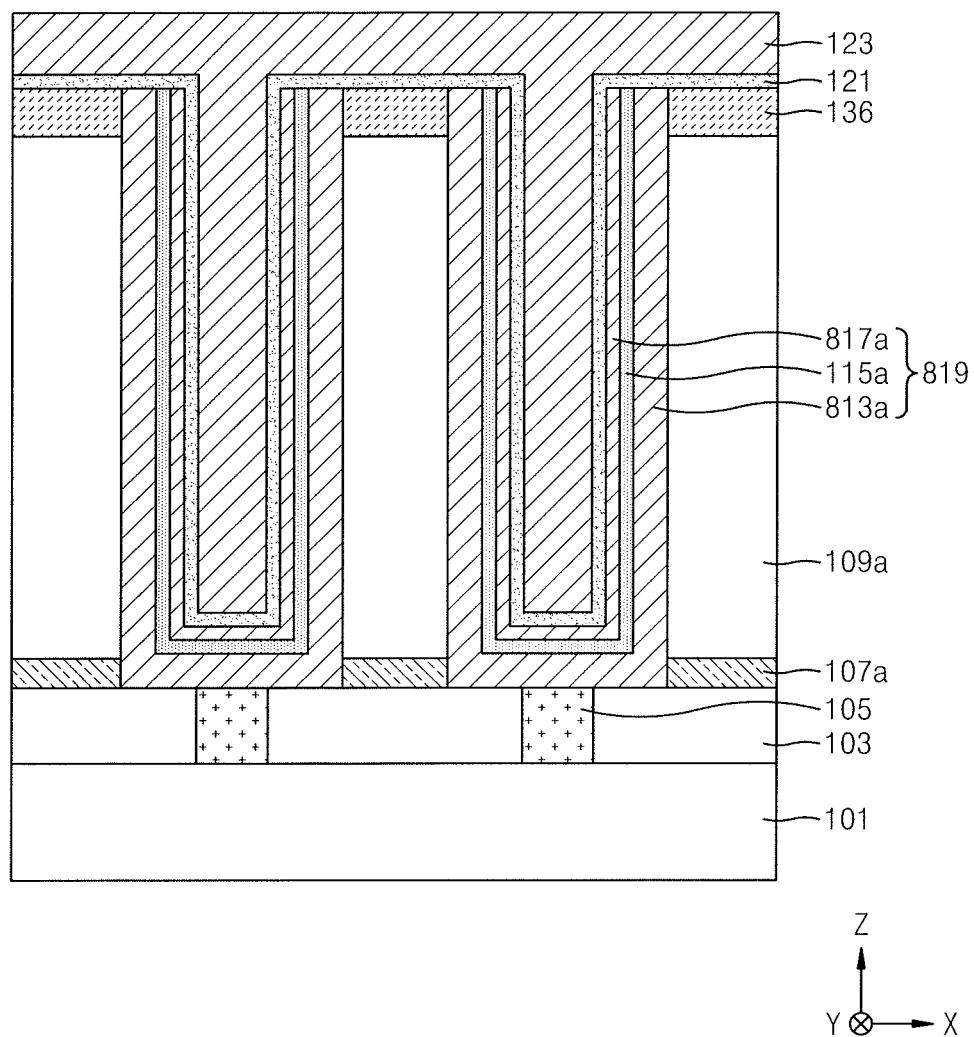

Referring to FIG. 22G, the dielectric layer 121 covering the bottom, inner side surfaces, and an upper surface of the second lower electrode pattern 817a, an upper surface of the barrier layer 115a, and an upper surface of the first lower electrode pattern 813a may be formed. The dielectric layer 121 may include $TiO_2$ or TiON formed, for example, by using TiH gas and $O_3$ gas as a reaction gas. The reaction gas $O_3$ may react with the second lower electrode pattern 817a and at least partially oxidize the second lower electrode pattern 817a. However, intrusion of the reaction $O_3$ into the first lower electrode pattern 813a may be prevented by the barrier layer 115a. Thus, oxidization of the first lower electrode pattern 813a may be suppressed. The dielectric layer 121 may be formed by ALD, CVD, or PVD.

After the dielectric layer 121 is formed, a heat treatment process may be further performed. The heat treatment process may improve crystallinity of the second lower electrode pattern 817a, which is underlying the dielectric layer 121, and thus may improve crystallinity of the dielectric layer 121 on the second lower electrode pattern 817a. When crystallinity of the dielectric layer 121 increases, a dielectric constant of the dielectric layer 121 may increase.

Afterwards, the upper electrode structure 123 may be formed on the dielectric layer 121 to manufacture the semiconductor device 800. The upper electrode structure 123 may be formed by ALD, CVD, or PVD.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
a substrate;
a lower electrode structure above the substrate and extending in a direction crossing an upper surface of the substrate;
a dielectric layer on side surfaces and an upper surface of the lower electrode structure; and
an upper electrode structure on the dielectric layer,
wherein the lower electrode structure comprises:
a first lower electrode pattern having a cylindrical shape comprising a side wall and a floor portion;
a barrier layer on an inner surface of the first lower electrode pattern; and
a second lower electrode pattern in a space defined by the barrier layer,
wherein the first lower electrode pattern comprises:

a first portion comprising a first metal element, the first portion including a center portion of the floor portion; and a second portion comprising an oxide of the first portion.

2. The semiconductor device of claim 1, wherein the first portion and the second portion are adjacent to each other with an interface therebetween, wherein the interface is on the side wall of the first lower electrode pattern.

3. The semiconductor device of claim 1, wherein the first portion and the second portion are adjacent to each other with an interface therebetween, wherein the interface is on the floor portion of the first lower electrode pattern.

4. The semiconductor device of claim 1, wherein the first portion comprises titanium nitride (TiN), and the second portion comprises titanium oxynitride (TiON) and/or titanium oxide ($TiO_2$).

5. The semiconductor device of claim 1, wherein the first portion comprises titanium nitride (TiN), and the second portion comprises titanium oxynitride (TiON) and titanium oxide ($TiO_2$).

6. The semiconductor device of claim 1, wherein a resistance of the second portion is greater than that of the first portion.

7. The semiconductor device of claim 1, further comprising a transition section between the first portion and the second portion, wherein a concentration of the oxide of the first portion gradually increases in the transition section.

8. The semiconductor device of claim 7, wherein, in the transition section, the concentration of the oxide of the first portion gradually increases in a direction from the first portion to the second portion.

9. The semiconductor device of claim 1, wherein the barrier layer has a multilayer structure in which a metal nitride layer and a silicon nitride layer are alternately stacked at least once.

10. The semiconductor device of claim 1, wherein the barrier layer has a multilayer structure comprising silicon, the multilayer structure comprising a structure in which a first barrier layer and a second barrier layer are sequentially stacked, wherein the first barrier layer abuts the first lower electrode pattern, and the second barrier layer abuts the second lower electrode pattern, wherein a silicon concentration of the second barrier layer is lower than that of the first barrier layer.

11. A semiconductor device comprising:

a substrate;

a lower electrode structure above the substrate and extending in a direction crossing an upper surface of the substrate;

a dielectric layer on side surfaces and an upper surface of the lower electrode structure; and an upper electrode structure on the dielectric layer, wherein the lower electrode structure comprises:

a first lower electrode pattern having a cylindrical shape comprising a side wall and a floor portion;

a barrier layer on an inner surface of the first lower electrode pattern; and a second lower electrode pattern in a space defined by the barrier layer and having a cylindrical shape comprising a side wall and a floor portion, wherein an outer side wall of the first lower electrode pattern is covered by an interlayer insulation layer, and wherein the second lower electrode pattern comprises a first portion comprising a first metal element and a second portion comprising an oxide of the first portion.

12. The semiconductor device of claim 11, wherein the first lower electrode pattern comprises a first portion comprising a first metal element, and the second lower electrode pattern comprises an oxide of the first portion.

13. The semiconductor device of claim 11, wherein the dielectric layer and the upper electrode structure are inserted in a space defined by the second lower electrode pattern.

14. The semiconductor device of claim 13, wherein the dielectric layer covers an inner surface and an upper surface of the second lower electrode pattern.

15. The semiconductor device of claim 14, wherein the dielectric layer horizontally extends to cover an upper surface of the barrier layer and an upper surface of the first lower electrode pattern.

16. The semiconductor device of claim 15, wherein the dielectric layer is connected to a dielectric layer of a neighboring semiconductor device at substantially the same level as an upper surface of the first lower electrode pattern.

17. The semiconductor device of claim 15, wherein the dielectric layer does not extend onto an outer side wall of the first lower electrode pattern.

18. A semiconductor device comprising:

a substrate;

a first interlayer insulation layer on the substrate and exposing an upper surface of a contact plug;

a first lower electrode pattern having a cylindrical shape comprising a floor portion and a side wall, wherein the floor portion is connected to the contact plug, and the side wall extends in a direction crossing the floor portion;

a barrier layer extending along an inner side wall of the first lower electrode pattern;

a second lower electrode pattern in a space defined by the barrier layer;

a dielectric layer contacting upper surfaces of the first lower electrode pattern, the barrier layer, and the second lower electrode pattern; and an upper electrode structure facing the second lower electrode pattern with the dielectric layer therebetween, wherein the first lower electrode pattern comprises:

a first portion having a first resistance; and a second portion having a second resistance 10 times or greater compared to the first resistance, wherein the first portion directly contacts the contact plug, and wherein at least a portion of the second portion is located over an outer side wall of the first portion.

* * * * *